United States Patent
Lee et al.

(10) Patent No.: US 10,361,699 B2
(45) Date of Patent: Jul. 23, 2019

(54) MEMORY MODULES, MEMORY SYSTEMS INCLUDING THE SAME, AND METHODS OF CALIBRATING MULTI-DIE IMPEDANCE OF THE MEMORY MODULES

(71) Applicant: SAMSUNG ELECTRONICS CO., LTD., Suwon-si, Gyeonggi-do (KR)

(72) Inventors: Jun-Ha Lee, Seoul (KR); Chang-Kyo Lee, Seoul (KR); Yoon-Joo Eom, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/922,332

(22) Filed: Mar. 15, 2018

(65) Prior Publication Data

US 2019/0052268 A1 Feb. 14, 2019

(30) Foreign Application Priority Data

Aug. 10, 2017 (KR) .......................... 10-2017-0101408

(51) Int. Cl.
*H03K 19/00* (2006.01)
*G11C 7/10* (2006.01)

(52) U.S. Cl.
CPC ....... *H03K 19/0005* (2013.01); *G11C 7/1057* (2013.01); *G11C 7/1084* (2013.01)

(58) Field of Classification Search
CPC .............. H03K 19/0005; G11C 7/1057; G11C 7/1051; G11C 7/1084
See application file for complete search history.

(56) References Cited

U.S. PATENT DOCUMENTS

| | | |
|---|---|---|
| 6,535,047 B2 | 3/2003 | Mughal et al. |
| 6,657,470 B1 | 12/2003 | Latham et al. |
| 7,728,619 B1 | 6/2010 | Tzou et al. |
| 8,917,110 B2 | 12/2014 | Ko |
| 9,317,052 B1 | 4/2016 | Hwang |
| 2011/0193590 A1 | 8/2011 | Nakagawa et al. |
| 2017/0109249 A1* | 4/2017 | Tatapudi .............. G11C 7/1057 |

FOREIGN PATENT DOCUMENTS

| | | |
|---|---|---|
| KR | 1020070088845 | 8/2007 |
| KR | 1020160061855 | 8/2016 |

* cited by examiner

*Primary Examiner* — Seokjin Kim
(74) *Attorney, Agent, or Firm* — F. Chau & Associates, LLC

(57) ABSTRACT

A memory module includes an external resistor and a plurality of memory devices commonly connected to the external resistor. Each of the memory devices includes a first reception pad and a first transmission pad. The first reception pad is associated with receiving an impedance calibration command and the first transmission pad is associated with transmitting the impedance calibration command. Each of the memory devices transfers the impedance calibration command to a first memory device which is selected as a master among the plurality of memory devices through a ring topology. The first memory device performs an impedance calibration operation, determines a resistance and a target output high level voltage of an output driver in response to the impedance calibration command, and transfers the impedance calibration command to a second memory device after performing the impedance calibration operation.

16 Claims, 19 Drawing Sheets

MEMORY MODULES, MEMORY SYSTEMS INCLUDING THE SAME, AND METHODS OF CALIBRATING MULTI-DIE IMPEDANCE OF THE MEMORY MODULES

CROSS-REFERENCE TO RELATED APPLICATION

This application claims priority under 35 U.S.C. § 119 to Korean Patent Application No. 10-2017-0101408, filed on Aug. 10, 2017 in the Korean Intellectual Property Office, the disclosure of which is incorporated by reference herein in its entirety.

TECHNICAL FIELD

Exemplary embodiments of the inventive concept described herein relate to memory devices, and more particularly, to memory modules, memory systems including the same, and methods of calibrating multi-die impedance of the memory modules.

DISCUSSION OF RELATED ART

As the operating speed of semiconductor memory devices has increased, swing width of signals interfaced between a semiconductor memory device and a memory controller has generally decreased. However, as swing width has decreased, signals transferred between the semiconductor memory device and the memory controller may be more easily distorted by impedance mismatch caused by process, voltage, and temperature (PVT) variations. An impedance calibration operation for adjusting output impedance and/or a termination impedance of the semiconductor memory device may be employed at transmitting and/or receiving stages of the semiconductor memory device. The impedance calibration operation may be referred to as an input/output (I/O) offset cancellation operation or a ZQ calibration operation.

SUMMARY

According to an exemplary embodiment of the inventive concept, a memory module includes an external resistor formed in a module board and a plurality of memory devices including a first memory device and a second memory device and commonly connected to the external resistor. Each of the plurality of memory devices includes a first reception pad and a first transmission pad. The first reception pad is associated with receiving an impedance calibration command and the first transmission pad is associated with transmitting the impedance calibration command. Each of the plurality of memory devices transfers the impedance calibration command to the first memory device, which is selected as a master among the plurality of memory devices, through a ring topology constituted by the first reception pad and the first transmission pad. The first memory device performs an impedance calibration operation for the first memory device, determines a resistance and a target output high level (VOH) voltage of an output driver in response to the impedance calibration command, and transfers the impedance calibration command to the second memory device adjacent to the first memory device through the first transmission pad of the first memory device after performing the impedance calibration operation for the first memory device.

According to an exemplary embodiment of the inventive concept, a memory system includes a memory module and a memory controller. The memory module includes an external resistor formed in a module board and a plurality of memory devices including a first memory device and a second memory device and commonly connected to the external resistor. The memory controller controls the memory module. Each of the plurality of memory devices includes a first reception pad and a first transmission pad. The first reception pad is associated with receiving an impedance calibration command and the first transmission pad is associated with transmitting the impedance calibration command. Each of the plurality of memory devices transfers the impedance calibration command to the first memory device, which is selected as a master among the plurality of memory devices, through a ring topology constituted by the first reception pad and the first transmission pad. The first memory device performs an impedance calibration operation for the first memory device, determines a resistance and a target output high level (VOH) voltage of an output driver in response to the impedance calibration command, and transfers the impedance calibration command to the second memory device adjacent to the first memory device through the first transmission pad of the first memory device after performing the impedance calibration operation for the first memory device.

According to an exemplary embodiment of the inventive concept, in a method of calibrating multi-die impedance of a memory module including an external resistor and a plurality of memory devices, where the external resistor is formed in a module board and the plurality of memory devices are commonly connected to the external resistor, a first memory device of the plurality of memory devices is selected as a master, an impedance calibration command is received in a second memory device of the plurality of memory devices, and an impedance calibration operation is sequentially performed in each of the plurality of memory devices from the first memory device using a ring topology constituted by a first reception pad and a first transmission pad included in each of the plurality of memory devices. The first reception pad is associated with receiving the impedance calibration command and the first transmission pad is associated with transmitting the impedance calibration command.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
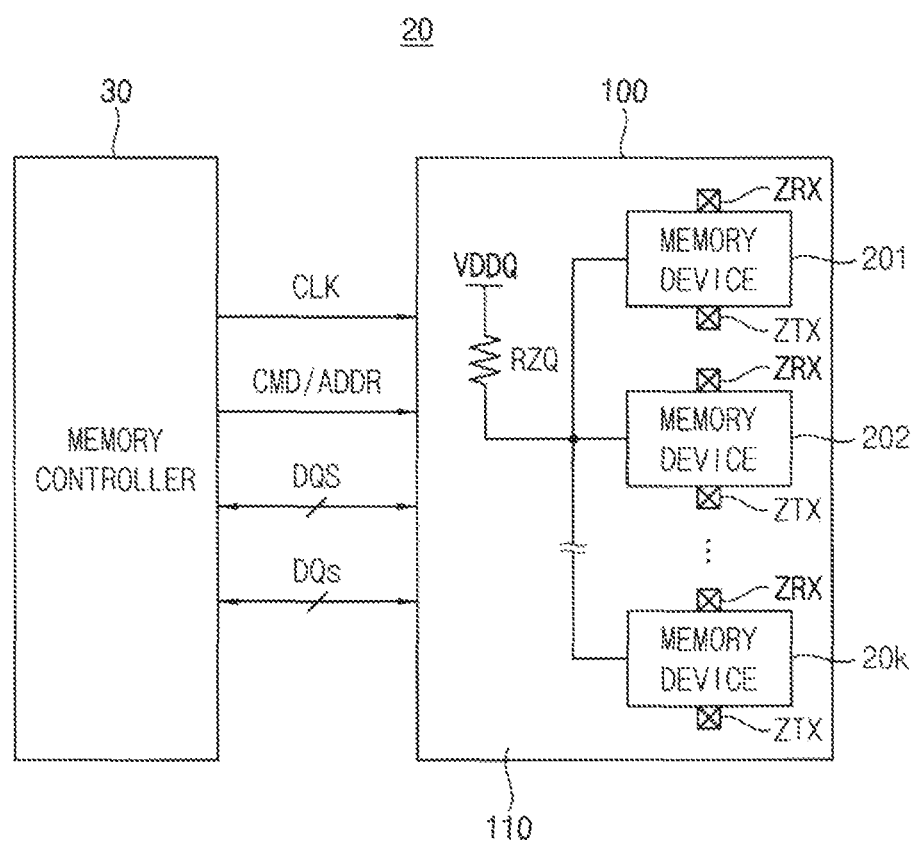
FIG. 1 is a block diagram illustrating a memory system according to an exemplary embodiment of the inventive concept.

Exemplary embodiments of the inventive concept provide a memory module, capable of enhancing performance by preventing abnormal operation of an impedance calibration operation.

Exemplary embodiments of the inventive concept provide a memory system including the memory module capable of enhancing performance.

Exemplary embodiments of the inventive concept provide a method of calibrating multi-die impedance of the memory module capable of enhancing performance.

Exemplary embodiments of the inventive concept will be described more fully hereinafter with reference to the accompanying drawings. Like reference numerals may refer to like elements throughout this application.

FIG. 1 is a block diagram illustrating a memory system according to an exemplary embodiment of the inventive concept.

Referring to FIG. 1, a memory system 20 may include a memory controller 30 and a memory module 100. The memory module 100 includes a plurality of memory devices 201~20$k$, where k is an integer greater than two. In exemplary embodiments of the inventive concept, each of the memory devices 201~20$k$ may be referred to as a memory chip and a memory die.

The memory controller 30 may control an overall operation of the memory system 20. The memory controller 30 may control an overall data exchange between an external central processing unit (CPU) and the plurality of memory devices 201~20$k$. For example, the memory controller 30 may write data in the plurality of memory devices 201~20$k$ or read data from the plurality of memory devices 201~20$k$ in response to a request from the CPU. In addition, the memory controller 30 may issue operation commands to the plurality of memory devices 201~20$k$ for controlling the plurality of memory devices 201~20$k$.

The memory controller 30 transmits, to the memory devices 201~20$k$, control signals such as a clock signal CLK, a command CMD, an address ADDR, data strobe signals DQS, and data signals DQs. The memory controller 30 also receives the data signals DQs and the data strobe signals DQS from the memory devices 201~20$k$. The memory controller 30 may transmit a write command, a read command, and an impedance calibration command to each of the memory devices 201~20$k$. Each of the memory devices 201~20$k$ may perform a write operation in response to the write command, a read operation in response to the read command, and an impedance calibration operation in response to the impedance calibration command.

In exemplary embodiments of the inventive concept, each of the plurality of memory devices 201~20$k$ may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), or the like.

The memory devices 201~20$k$ may be commonly connected to an external resistor RZQ formed in a module board 110. The external resistor RZQ may be connected to a power supply voltage VDDQ. Each of the memory devices 201~20$k$ may include a first reception pad ZRX associated with receiving the impedance calibration command and a first transmission pad ZTX associated with transmitting the impedance calibration command. The first transmission pad ZTX and the first reception pad ZRX of two adjacent memory devices among the memory devices 201~20$k$ may be connected to each other and the first transmission pad ZTX and the first reception pad ZRX of each of the memory devices 201~20$k$ may constitute a ring topology.

Each of the plurality of memory devices 201~20$k$ may transfer the impedance calibration command to a first memory device which is selected as a master among the plurality of memory devices 201~20$k$ through the ring topology. The first memory device may perform the impedance calibration operation of the first memory device, to determine a resistance and a target output high level (VOH) voltage of an output driver, in response to the impedance calibration command, and may sequentially transfer the impedance calibration command to other memory devices, which are not selected as the master, after performing the impedance calibration operation such that a corresponding impedance calibration operation is sequentially performed in each of the other memory devices. Therefore, the impedance calibration operation is sequentially performed in each of the memory devices 201~20k in response to the impedance calibration command that is sequentially received to prevent the impedance calibration from being overlapped in at least two memory devices. Therefore, the memory module 100 may enhance performance by preventing an abnormal output voltage level and an abnormal resistance from being set.

Figure 2:
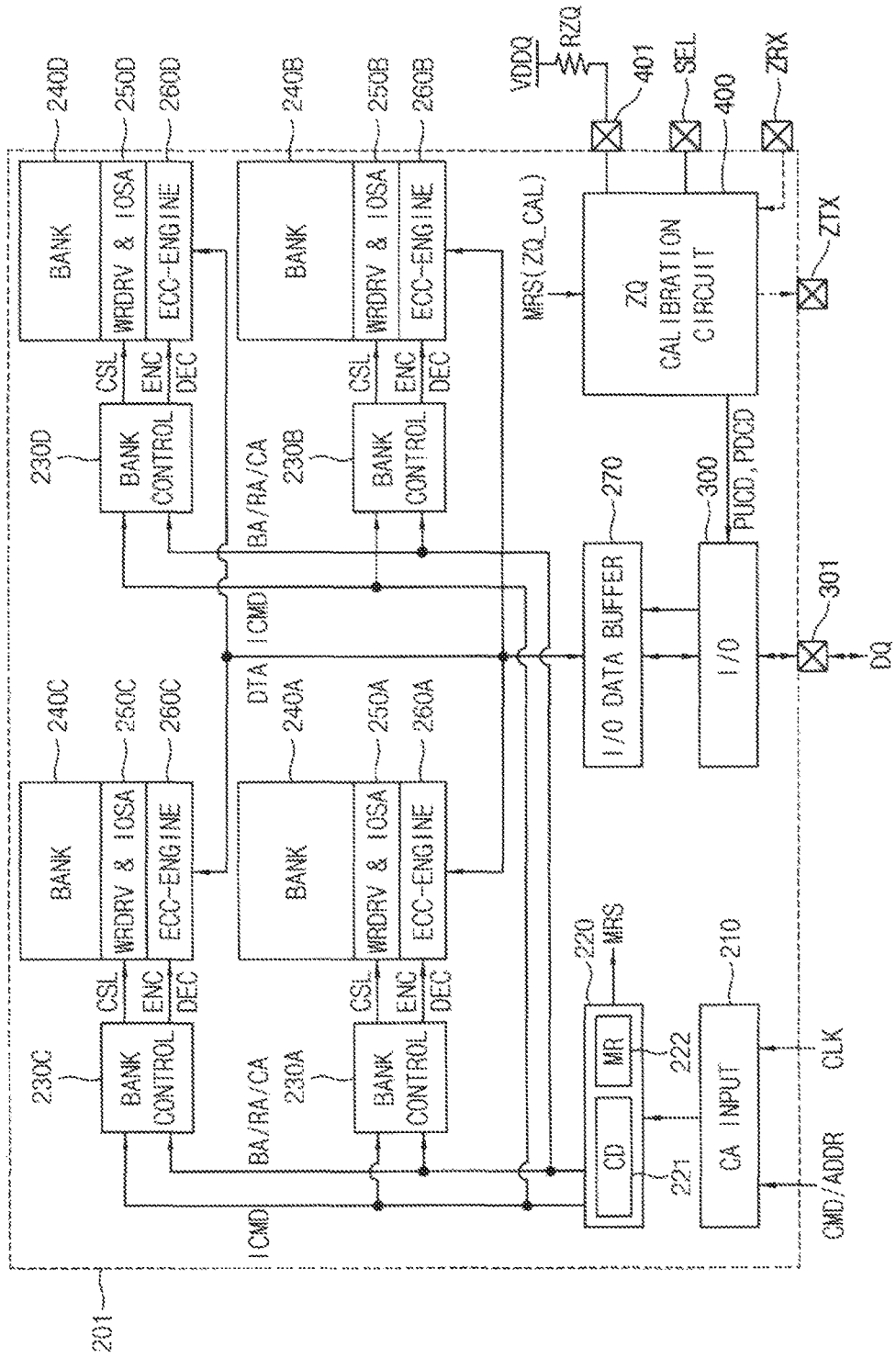
FIG. 2 illustrates a block diagram of a memory device of FIG. 1 according to an exemplary embodiment of the inventive concept.

FIG. 2 illustrates a block diagram of a memory device of FIG. 1 according to an exemplary embodiment of the inventive concept.

Referring to FIG. 2, the memory device 201 includes a command/address input buffer (CA Input) 210, a control logic circuit 220, bank control logics (Bank Control) 230A~230D, a memory cell array (Bank) 240A~240D, write driver and data input/output (I/O) sense amplifiers (WRDRV & IOSA) 250A~250D, error correction code (ECC) engines 260A~260D, an I/O data buffer 270, an I/O circuit 300, and an impedance calibration circuit (ZQ Calibration Circuit) 400.

The memory cell array 240A~240D may include first through fourth bank arrays 240A~240D in which a plurality of memory cells are arrayed in rows and columns. A row decoder and a column decoder for selecting word-lines and bit-lines that are connected to the memory cells may be connected to each of the first through fourth bank arrays 240A~240D. The row decoders and the column decoders may be disposed in the bank control logics 230A~230D. In the present exemplary embodiment described with respect to FIG. 2, the memory device 201 includes the four bank arrays 240A~240D, but the inventive concept is not limited thereto and the memory device 201 may include any arbitrary number of banks.

The command/address input buffer 210 may receive the clock signal CLK, the command CMD, and the address ADDR from the memory controller 30. The command CMD and the address ADDR may be input via the same terminals, e.g., CA pads. The command CMD and the address ADDR may be sequentially input via the CA pads.

The control logic circuit 220 may receive the command CMD and the address ADDR via the command/address input buffer 210, and may generate an internal command ICMD, a mode register set signal MRS, an impedance calibration enable signal ZQEN, and an address signal (BA/RA/CA). The internal command ICMD may include an internal read command and an internal write command. The address signal may include a bank address BA, a row address RA, and a column address CA. The internal command ICMD and the address signal BA/RA/CA may be provided to each of the bank control logics 230A~230D.

The control logic circuit 220 includes a command decoder (CD) 221 and a mode register (MR) 222. The command decoder 221 decodes the command CMD to generate the internal command ICMD and the mode register 222 may set an operation mode of the memory device 201 based on the command CMD and the address ADDR. The mode register 222 may generate the mode register set signal MRS based on the CMD and the address ADDR and may provide the mode register set signal MRS to the impedance calibration circuit 400. The mode register set signal MRS may include an impedance calibration command ZQ_CAL.

Each of the bank control logics 230A~230D may be activated responsive to corresponding bank addresses BA. The activated bank control logics 230A~230D may generate bank control signals in response to the internal command ICMD, the row address RA, and the column address CA. In response to the bank control signals, the row decoder and the column decoder corresponding to the first through fourth bank arrays 240A~240D that are connected to the activated bank control logics 230A~230D may be activated.

The row decoder corresponding to each of the first through fourth bank arrays 240A~240D may decode the row address RA and therefore may enable a word-line that corresponds to the row address RA. The column address CA provided for each of the first through fourth bank arrays 240A~240D may be temporarily stored in a column address latch. The column address latch may increase, in a stepwise fashion, the column address CA in a burst mode. The temporarily stored or stepwise increased column address CA may be provided to the column decoder. The column decoder may decode the column address CA and therefore may activate a column selection signal CSL that corresponds to the column address CA.

In response to the bank control signals, each of the bank control logics 230A~230D may generate an ECC encoding signal ENC and an ECC decoding signal DEC for controlling operations of the ECC engines 260A~260D that are connected to the first through fourth bank arrays 240A~240D, respectively. The write driver and data I/O sense amplifiers 250A~250D may sense and amplify a plurality of pieces of read data output from the first through fourth bank arrays 240A~240D, respectively, and may transmit a plurality of pieces of write data to be stored to the first through fourth bank arrays 240A~240D, respectively.

During a write operation, each of the ECC engines 260A~260D may generate parity bits by performing an ECC encoding operation on the plurality of pieces of write data to be stored in each of the first through fourth bank arrays 240A~240D, in response to the ECC encoding signals ENC output from the respective bank control logics 230A~230D. During a read operation, each of the ECC engines 260A~260D may perform an ECC decoding operation by using the plurality of pieces of data and parity bits that are read from each of the first through fourth bank arrays 240A~240D, in response to the ECC decoding signals DEC output from the respective bank control logics 230A~230D, and therefore may detect and correct an error bit in the plurality of pieces of read data.

The I/O data buffer 270 may include circuits for gating a plurality of pieces of data that are input to or output from the first through fourth bank arrays 240A~240D; read data latches for storing the plurality of pieces of data output from the first through fourth bank arrays 240A~240D; and write data latches for storing the plurality of pieces of data to be written into the first through fourth bank arrays 240A~240D. The I/O data buffer 270 may convert parallel data bits that are output from the first through fourth bank arrays 240A~240D into serial data bits via the read data latches. The I/O data buffer 270 may convert a plurality of pieces of write data that are serially received into parallel data bits by using the write data latches.

The I/O circuit 300 may receive the serial data bits output from the I/O data buffer 270, may sequentially array the serial data bits as data bits that correspond to a burst length, and then may output together the data bits and the data strobe signal DQS to data I/O pads.

The I/O circuit 300 may output the data signal DQ having the target output high level voltage (VOH) voltage to the memory controller 30 via a data I/O pad 301 by driving data bits based on a pull-up control code PUCD and a pull-down control code PDCD provided from the impedance calibration circuit 400.

The impedance calibration circuit 400 may be connected to the external resistor RZQ through a ZQ pad (or an impedance pad) 401 and the external resistor RZQ may be coupled to the power supply voltage VDDQ. In exemplary embodiments of the inventive concept, the external resistor RZQ may be coupled to a ground voltage. The impedance calibration circuit 400 may be connected to the first reception pad ZRX, the first transmission pad ZTX, and a selection pad SEL.

The impedance calibration circuit 400 may generate the pull-up control code PUCD and the pull-down control codes PDCD for the target VOH voltage and store the pull-up control code PUCD and the pull-down control code PDCD, in response to the mode register set signal MRS during an impedance calibration interval. The impedance calibration circuit 400 may output the pull-up control code PUCD and the pull-down control code PDCD to a data output circuit of the I/O circuit 300 in a normal operation interval of the memory device 201.

Figure 3:
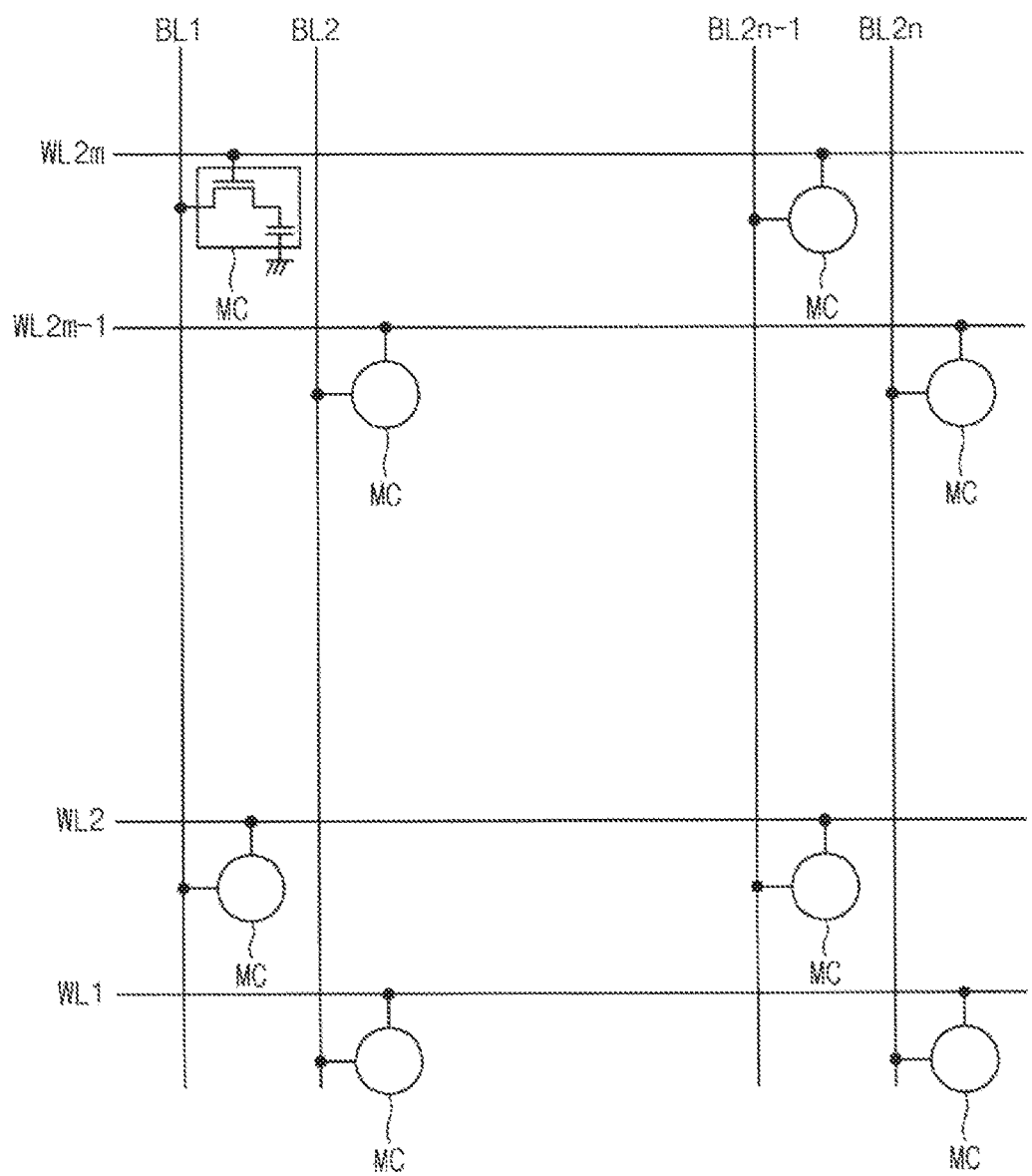
FIG. 3 illustrates a first bank array in the memory device of FIG. 2 according to an exemplary embodiment of the inventive concept.

FIG. 3 illustrates a first bank array in the memory device of FIG. 2 according to an exemplary embodiment of the inventive concept.

Referring to FIG. 3, the first bank array 240A includes a plurality of word-lines WL1, WL2, WL2m-1, and WL2m (e.g., WL~WL2m) where m is a natural number greater than two, a plurality of bit-lines BL1, BL2, BL2n-1, and BL2n (e.g., BL1~BL2n) where n is a natural number greater than two, and a plurality of memory cells MC disposed near intersections between the word-lines WL1~WL2m and the bit-lines BL1~BL2n. In exemplary embodiments of the inventive concept, each of the plurality of memory cells MC may include a dynamic random access memory (DRAM) cell structure. The plurality of word-lines WL1~WL2m, to which the plurality of memory cells MC are connected, may be referred to as rows of the first bank array 240A and the plurality of bit-lines BL1~BL2n, to which the plurality of memory cells MC are connected, may be referred to as columns of the first bank array 240A.

Figure 4:
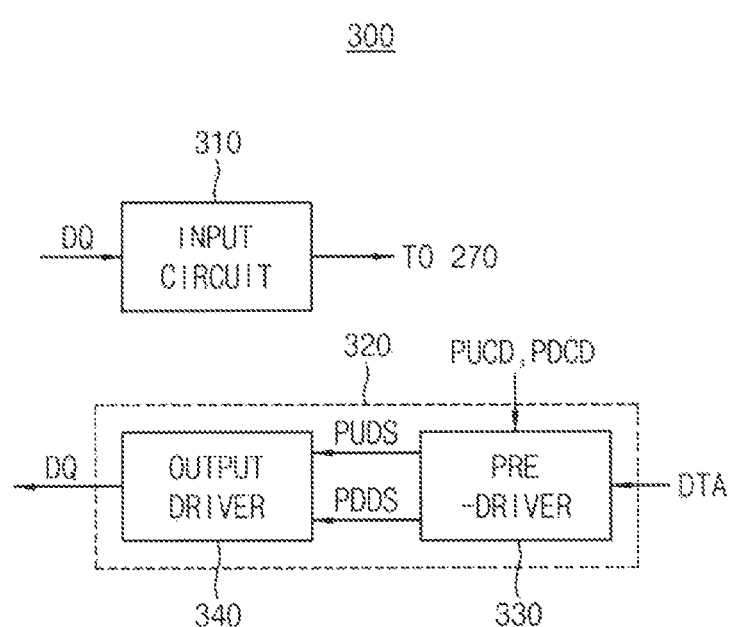
FIG. 4 illustrates an I/O circuit in the memory device of FIG. 2 according to an exemplary embodiment of the inventive concept.

FIG. 4 illustrates an I/O circuit in the memory device of FIG. 2 according to an exemplary embodiment of the inventive concept.

Referring to FIG. 4, the I/O circuit 300 includes a data input circuit 310 and a data output circuit 320. The data output circuit 320 includes a pre-driver 330 and an output driver 340.

The data input circuit 310 may receive the data signal DQ from the memory controller 30 and may provide the data signal DQ to the I/O data buffer 270. The data output circuit 320 may convert data DTA from the I/O data buffer 270 to the data signal DQ and provide the data signal DQ to the memory controller 30.

The pre-driver 330 may receive the data DTA, generate a pull-up driving signal PUDS and a pull-down driving signal PDDS based on the pull-up control code PUCD and the pull-down control code PDCD, and provide the pull-up driving signal PUDS and the pull-down driving signal PDDS to the output driver 340.

For example, when the data DTA is at a high level, the pre-driver 330 may buffer the pull-up control code PUCD and generate the pull-up driving signal PUDS to be substantially the same as the pull-up control code PUCD, and generate the pull-down driving signal PDDS for turning off all transistors included in a pull-down driver (such as a pull-down driver 343 shown in FIG. 5) of the output driver 340. Contrarily, when the data DTA is at a low level, the pre-driver 330 may buffer the pull-down control code PDCD and generate the pull-down driving signal PDDS to be substantially the same as the pull-down control code PDCD, and generate the pull-up driving signal PUDS for turning off all transistors included in a pull-up driver (such as a pull-up driver 341 shown in FIG. 5) of the output driver 340. The pre-driver 330 may determine a current generated by the pull-up driver 341 and a resistance of the pull-down driver 343 (shown in FIG. 5) when the output driver 340 outputs the data signal DQ.

Figure 5:
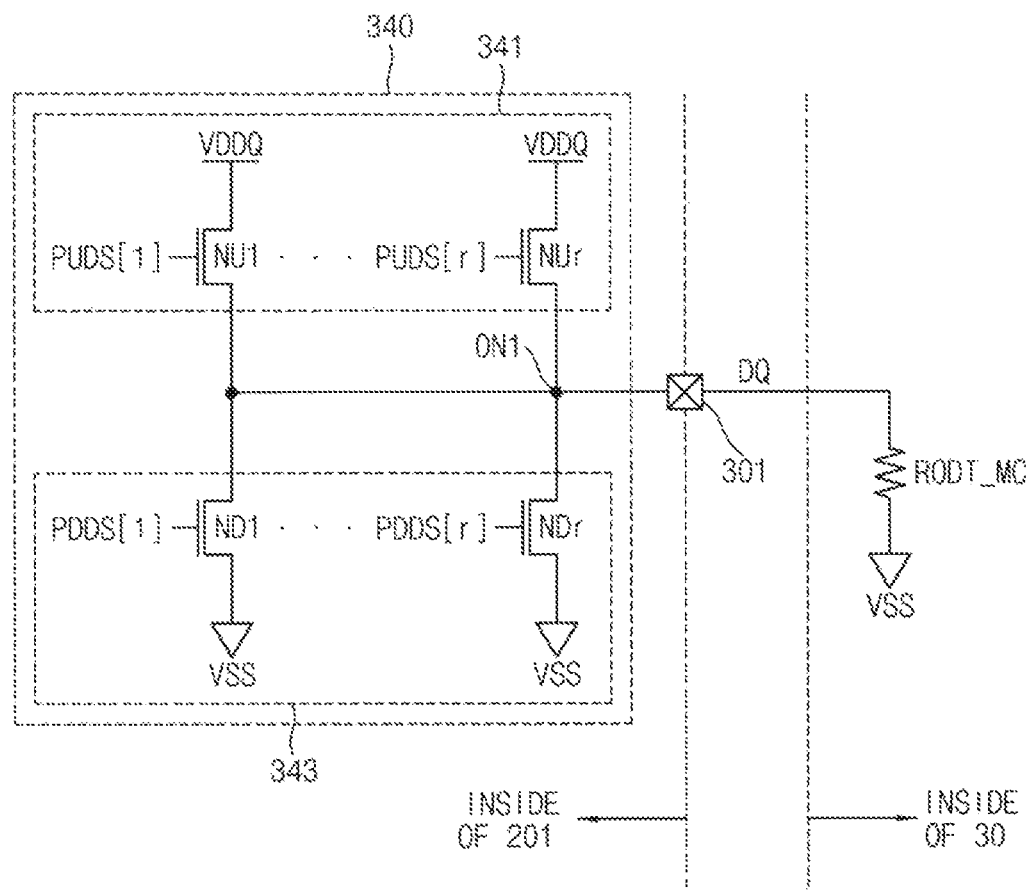
FIG. 5 illustrates a circuit diagram of an output driver in the I/O circuit in FIG. 4 according to an exemplary embodiment of the inventive concept.

FIG. 5 illustrates a circuit diagram of an output driver in the I/O circuit in FIG. 4 according to an exemplary embodiment of the inventive concept.

Referring to FIG. 5, the output driver 340 may include the pull-up driver 341 and the pull-down driver 343.

The pull-up driver 341 may include first through r-th (r is a natural number greater than 1) pull-up transistors NU1 through NUr connected between the power supply voltage VDDQ and an output node ON1. Each of the first through r-th pull-up transistors NU1 through NUr may be an n-channel metal oxide semiconductor (NMOS) transistor.

The pull-down driver 343 may include first through r-th pull-down transistors ND1 through NDr connected between the output node ON1 and a ground voltage VSS. Each of the first through r-th pull-down transistors ND1 through NDr may be an NMOS transistor.

When the data DTA is at the high level, the pull-up driver 341 may receive the pull-up driving signal PUDS (e.g., PUDS[1] through PUDS[r]) corresponding to the pull-up control code PUCD from the pre-driver 330 and generate the current determined by the pull-up control code PUCD. The pull-down transistors ND1 through NDr included in the pull-down driver 343 may all be turned off according to the pull-down driving signal PDDS (e.g., PDDS[1] through PDDS[r]).

At this time, when the data DTA is at the high level, the current generated by the pull-up driver 341 may be transmitted to an on-die termination (ODT) resistor RODT_MC in the memory controller 30 via the data I/O (or DQ) pad 301. The data signal DQ that the ODT resistor RODT_MC receives is determined by the current generated by the pull-up driver 341 and the ODT resistor RODT_MC, and has the target VOH voltage that has been adjusted according to the pull-up control code PUCD generated by the impedance calibration circuit 400.

When the data DTA is at the low level, the pull-up transistors NU1 through NUr included in the pull-up driver 341 may all be turned off according to the pull-up driving signal PUDS. The pull-down driver 343 may receive the pull-down driving signal PDDS corresponding to the pull-down control code PDCD from the pre-driver 330 and may have a resistance determined by the pull-down control code PDCD.

At this time, when the data DTA is at the low level, no current is generated by the pull-up driver 341, and therefore, the data signal DQ that the ODT resistor RODT_MC receives has an output low level voltage (VOL) voltage which is substantially the same as the ground voltage VSS.

According to an exemplary embodiment of the inventive concept, the total resistance, e.g., a termination resistance (RTT), of the pull-up driver 341 or the pull-down driver 343 may be changed in response to a particular pull-up or pull-down driving signal PUDS or PDDS. At this time, single loading or double loading can be implemented by changing the number of memory modules inserted into a memory slot and an RTT appropriate to conditions can be selected.

Figure 6:
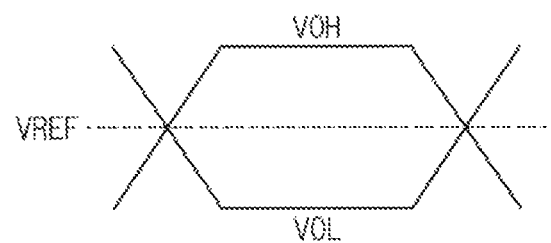
FIG. 6 illustrates a diagram for explaining an operation of a data output circuit in FIG. 5 according to an exemplary embodiment of the inventive concept.

FIG. 6 illustrates a diagram for explaining the operation of a data output circuit in FIG. 5 according to an exemplary embodiment of the inventive concept.

Referring to FIG. 6, the data signal DQ may have a high level or a low level according to the data DTA. The data signal DQ is an alternating current (AC) signal that swings between VOH and VOL.

The memory controller 30 may receive the data signal DQ from each of the memory devices 201~20k, determine the VOH and VOL voltages, and determine a reference voltage VREF from the VOH and VOL voltages. The memory controller 30 may compare the data signal DQ with the reference voltage VREF and determine a received data value (e.g., 0 or 1).

Various process-voltage-temperature (PVT) conditions may be applied to each of the memory devices 201~20k. The PVT conditions may include non-uniform doping in a wafer process, a voltage drop as current passes through different elements when power is supplied, and a temperature along a path through which a signal passes. AC on-resistance (hereinafter, referred to as "Ron AC") at the output side of the memory devices 201~20k may vary with the PVT conditions, and the VOH voltage of the data signal DQ may vary with the Ron AC.

Various operating frequencies may be applied to each of the memory devices 201~20k. When the operating frequency is changed, the VOH voltage of the data signal DQ may vary. Therefore, signal integrity of each of the memory devices 201~20k may be enhanced by generating the pull-up control code PUCD and the pull-down control code PDCD according to the PVT conditions (e.g., operating parameters) and the operating frequency, such that the data signal DQ has an optimum VOH voltage.

The impedance calibration circuit 400 may generate the pull-up control code PUCD and the pull-down control codes PDCD for the target VOH voltage and store the pull-up control code PUCD and the pull-down control code PDCD, in response to the mode register set signal MRS during the impedance calibration interval.

During the normal operation interval, the impedance calibration circuit 400 may provide the data output circuit 320 with the first pull-up control code PUCD and the first pull-down control code PDCD for the target VOH voltage, and the data output circuit 320 may transmit the data signal DQ to the memory controller 30 based on the first pull-up control code PUCD and the first pull-down control code PDCD. The mode register set signal MRS may include information about the impedance of the ODT resistor RODT_MC of the memory controller 30 and may include information indicating whether to increase or decrease the VOH voltage of the data signal DQ. The mode register set signal MRS may include the impedance calibration command ZQ_CAL.

Figure 7:
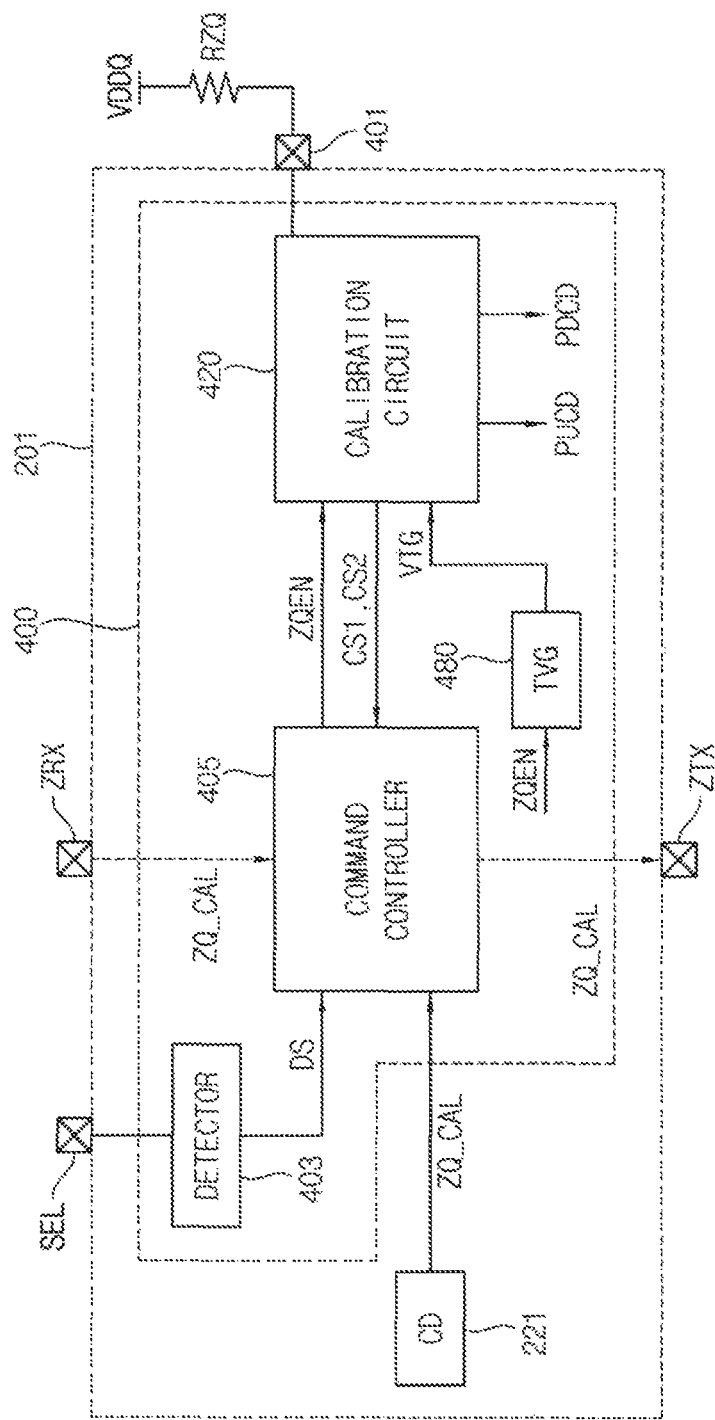
FIG. 7 illustrates a block diagram of an impedance calibration circuit in the memory device of FIG. 2 according to an exemplary embodiment of the inventive concept.

FIG. 7 illustrates a block diagram of an impedance calibration circuit in the memory device of FIG. 2 according to an exemplary embodiment of the inventive concept.

Referring to FIG. 7, the impedance calibration circuit 400 may include a detector 403 connected to the selection pad SEL, a command controller 405, a calibration circuit 420, and a target voltage generator 480.

The detector 403 is connected to the selection pad SEL, provides the command controller 405 with a detection signal DS having a first logic level when a corresponding memory device (for example, the memory device 201) is selected as a master, and provides the command controller 405 with the detection signal DS having a second logic level when the corresponding memory device is not selected as the master. When the corresponding memory device is selected as a master, the selection pad SEL is connected to the ground voltage (e.g., VSS) or the power supply voltage (e.g., VDDQ).

The command controller 405 is connected to the first reception pad ZRX and the first transmission pad ZTX and receives the impedance calibration command ZQ_CAL from one of the first reception pad ZRX and a corresponding command decoder 221. The calibration circuit 420 is connected to the external resistor RZQ through the impedance pad 401, performs the impedance calibration operation in response to an calibration enable signal ZQEN from the command controller 405, outputs the pull-up control code PUCD and the pull-down control code PDCD to the output driver 340, and provides the command controller 405 with a first comparison signal CS1 and a second comparison signal CS2 which indicate a completion of the impedance calibration operation.

The target voltage generator 480 generates the target VOH voltage (hereinafter, also referred to as "VTG") in response to the calibration enable signal ZQEN and provides the target VOH voltage VTG to the calibration circuit 420.

When the detection signal DS indicates that the memory device 201 is selected as the master and the impedance calibration command ZQ_CAL is received from the command decoder 221, the command controller 405 may enable the calibration enable signal ZQEN with a first level to provide the calibration enable signal ZQEN to the calibration circuit 420, and may transfer the impedance calibration command ZQ_CAL to an adjacent memory device through the first transmission pad ZTX when the first comparison signal CS1 and the second comparison signal CS2 indicate a completion of the impedance calibration operation. The impedance calibration command ZQ_CAL may include tag information which indicates whether the received impedance calibration command ZQ_CAL passes through the master.

When the impedance calibration command ZQ_CAL is received from the memory controller 30, the tag information has a first logic level. When the master completes the impedance calibration operation, the master may change a logic level of the tag information to the first logic level and may transfer the impedance calibration command ZQ_CAL to an adjacent memory device. When the impedance calibration command ZQ_CAL is received via the master, the tag information has the first logic level.

When the detection signal DS indicates that the memory device 201 is not selected as the master, the impedance calibration command ZQ_CAL is received from the first reception pad ZRX, and the tag information has the first logic level, the command controller 405 may maintain the calibration enable signal ZQEN at the first level to provide the calibration enable signal ZQEN to the calibration circuit 420, and may transfer the impedance calibration command ZQ_CAL to an adjacent memory device through the first transmission pad ZTX when the first comparison signal CS1 and the second comparison signal CS2 indicate a completion of the impedance calibration operation.

When the detection signal DS indicates that the memory device 201 is not selected as the master, the impedance calibration command ZQ_CAL is received from the first reception pad ZRX or from the command decoder 221, and the tag information has the second logic level, the command controller 405 may disable the calibration enable signal ZQEN with a second level to provide the calibration enable signal ZQEN to the calibration circuit 420, and may transfer the impedance calibration command ZQ_CAL to an adjacent memory device through the first transmission pad ZTX.

Figure 8A:
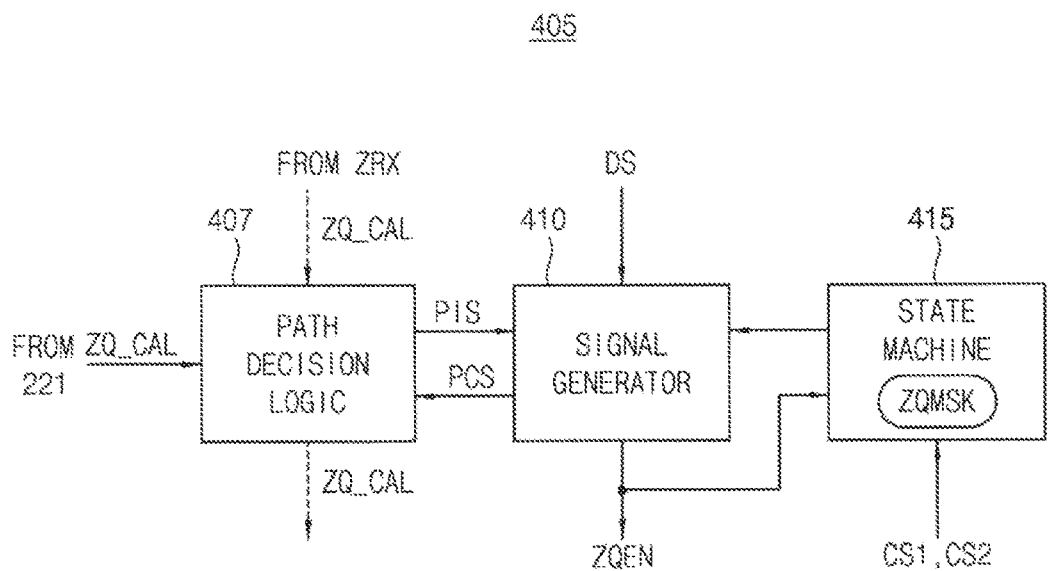
FIG. 8A illustrates a block diagram of a command controller in the impedance calibration circuit of FIG. 7 according to an exemplary embodiment of the inventive concept.

FIG. 8A illustrates a block diagram of a command controller in the impedance calibration circuit of FIG. 7 according to an exemplary embodiment of the inventive concept.

Referring to FIG. 8A, the command controller 405 includes a path decision logic 407, a signal generator 410, and a state machine 415.

The path decision logic 407 receives the impedance calibration command ZQ_CAL from one of the first reception pad ZRX and the command decoder 212, and provides a path information signal PIS that indicates a reception path of the impedance calibration command ZQ_CAL and the tag information to the signal generator 410. The signal generator 410 determines a logic level of the calibration enable signal ZQEN in response to the detection signal DS and the path information signal PIS to output the calibration enable signal ZQEN to the state machine 415 and the calibration circuit 420.

The state machine 415 determines a logic level of an internal calibration mask signal ZQMSK based on the calibration enable signal ZQEN and transitions of the first comparison signal and the second comparison signal CS. The signal generator 410 provides the path decision logic 407 with a path control signal PCS to control a transfer of the impedance calibration command ZQ_CAL and to a change a level of the tag information based on a state of the state machine 415. The path decision logic 407 may maintain or change a level of the tag information of the impedance calibration command ZQ_CAL and may provide the impedance calibration command ZQ_CAL to the adjacent memory device, in response to the path control signal PCS.

Figure 8B:
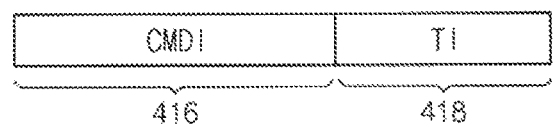
FIG. 8B illustrates a configuration of an impedance calibration command according to an exemplary embodiment of the inventive concept.

FIG. 8B illustrates a configuration of an impedance calibration command according to an exemplary embodiment of the inventive concept.

Referring to FIG. 8B, the impedance calibration command ZQ_CAL may include a command field 416 associated with command information CMDI and a tag field 418 associated with tag information TI. The command field 416 may direct the impedance calibration operation. The path decision logic 407 in FIG. 8A may maintain or change a level of the tag information TI of the impedance calibration command ZQ_CAL, and may provide the impedance calibration command ZQ_CAL to the adjacent memory device, in response to the path control signal PCS. In exemplary embodiments of the inventive concept, the tag information TI may be not included in the impedance calibration command ZQ_CAL, and the tag information TI may be provided to the adjacent memory device separately from the impedance calibration command ZQ_CAL.

Figure 9:
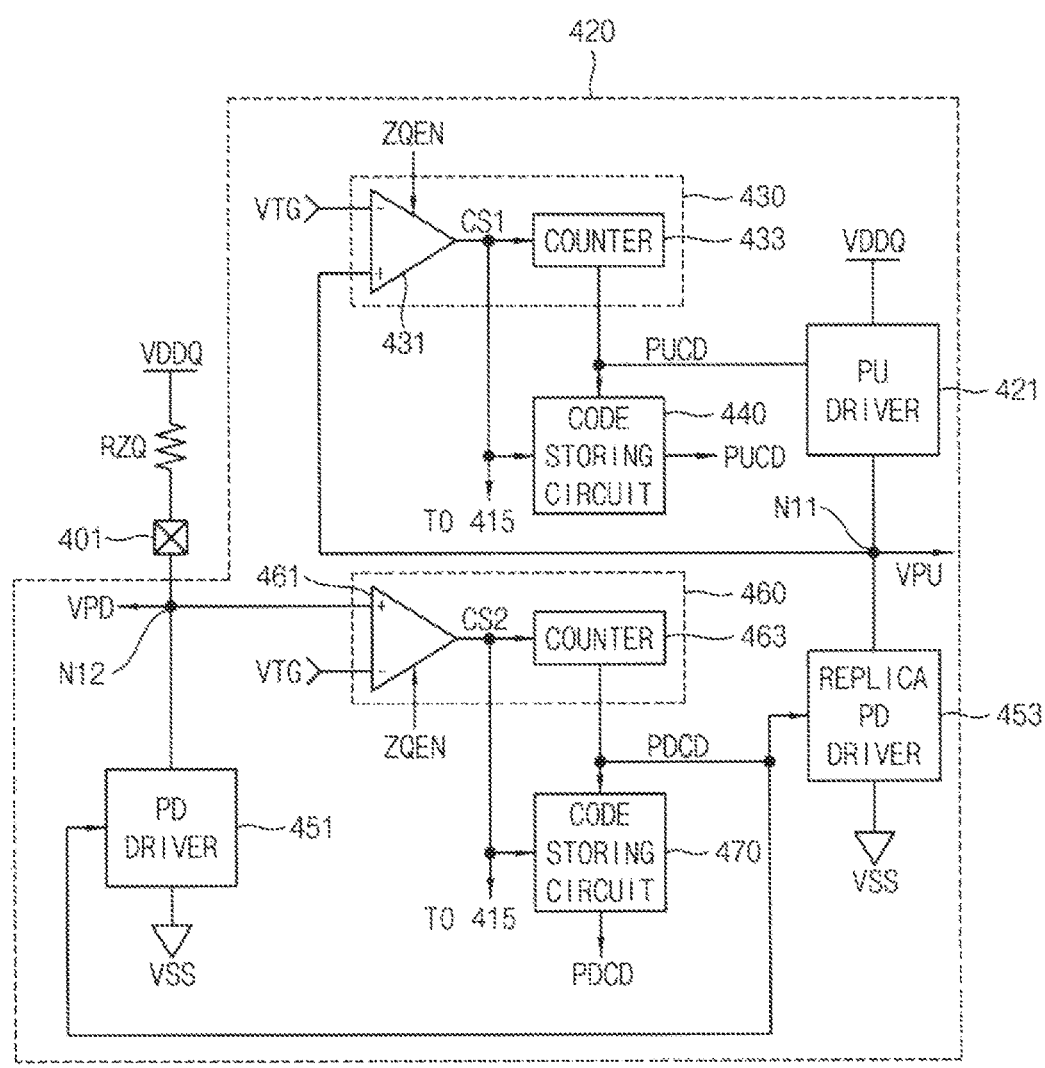
FIG. 9 illustrates a block diagram of a calibration circuit in the impedance calibration circuit of FIG. 7 according to an exemplary embodiment of the inventive concept.

FIG. 9 illustrates a block diagram of a calibration circuit in the impedance calibration circuit of FIG. 7 according to an exemplary embodiment of the inventive concept.

Referring to FIG. 9, the calibration circuit 420 includes a pull-up (PU) driver 421, a first code generator 430, a first code storing circuit 440, a pull-down (PD) driver 451, a replica pull-down (PD) driver 453, a second code generator 460, and a second code storing circuit 470.

The pull-up driver 421 is connected between the power supply voltage VDDQ and a first node N11, and may have a configuration similar to the pull-up driver 341 in FIG. 5. The replica pull-down driver 453 is connected between the first node N11 and the ground voltage VSS, and may have a configuration similar to the pull-down driver 343 in FIG. 5. The pull-down driver 451 is connected between a second node N12 and the ground voltage VSS, and the second node N12 is coupled to the impedance pad 401 coupled to the external resistor RZQ. The pull-down driver 451 may have a configuration similar to the pull-down driver 343 in FIG. 5.

The first code generator 430 may generate the pull-up control code PUCD obtained from a result of comparing the target VOH voltage VTG with a first voltage (or a pull-up voltage) VPU of the first node N11. The first code generator 430 includes a first comparator 431 and a first counter 433.

The first comparator 431 may be enabled in response to the calibration enable signal ZQEN, may compare the target VOH voltage VTG with the first voltage VPU to output the first comparison signal CS1, and may provide the first comparison signal CS1 to the first counter 433, the first code storing circuit 440, and the state machine 415. The first counter 433 may perform a counting operation in response to the first comparison signal CS1 to generate the pull-up control code PUCD and may perform a counting operation to increase or decrease the pull-up control code PUCD until a logic level of the first comparison signal CS1 transits. The first counter 433 may provide the pull-up control code PUCD to the pull-up driver 421 and the first code storing circuit 440.

The pull-up driver 421 may adjust/calibrate a pull-up impedance in response to the pull-up control code PUCD. The pull-up control code PUCD may be calibrated/changed until the target VOH voltage VTG becomes substantially the same as the pull-up voltage VPU.

The first code storing circuit 440 may store the pull-up control code PUCD when the logic level of the first comparison signal CS1 transits. In other words, the first code storing circuit 440 may store the pull-up control code PUCD when the target VOH voltage VTG becomes the pull-up voltage VPU.

The second code generator 460 may generate the pull-down control code PDCD obtained from a result of comparing the target VOH voltage VTG with a second voltage (or a pull-down voltage) VPD of the second node N12. The second code generator 460 includes a second comparator 461 and a second counter 463.

The second comparator 461 may be enabled in response to the calibration enable signal ZQEN, may compare the target VOH voltage VTG with the second voltage VPD to output the second comparison signal CS2 and may provide the second comparison signal CS2 to the second counter 463, the second code storing circuit 470, and the state machine 415. The second counter 463 may perform a counting operation in response to the second comparison signal CS2 to generate the pull-down control code PDCD and may perform a counting operation to increase or decrease the pull-down control code PDCD until a logic level of the second comparison signal CS2 transits. The second counter 463 may provide the pull-down control code PDCD to the pull-down driver 451, the replica pull-down driver 453, and the second code storing circuit 470.

The pull-down driver 451 may adjust/calibrate a pull-down impedance in response to the pull-down control code PDCD. The replica pull-down driver 453 may adjust/calibrate a pull-down impedance in response to the pull-down control code PDCD. The pull-down control code PDCD may be calibrated/changed until the target VOH voltage VTG becomes substantially the same as the pull-down voltage VPD. The second code storing circuit 470 may store the pull-down control code PDCD when the logic level of the second comparison signal CS2 transits. In other words, the second code storing circuit 470 may store the pull-down control code PDCD when the target VOH voltage VTG becomes the pull-down voltage VPD.

The calibration circuit 420 provides the first comparison signal CS1 and the second comparison signal CS2 to the state machine 415, and the state machine 415 detects a completion of the impedance calibration operation based on transitions of the first comparison signal CS1 and the second comparison signal CS2.

Figure 10:
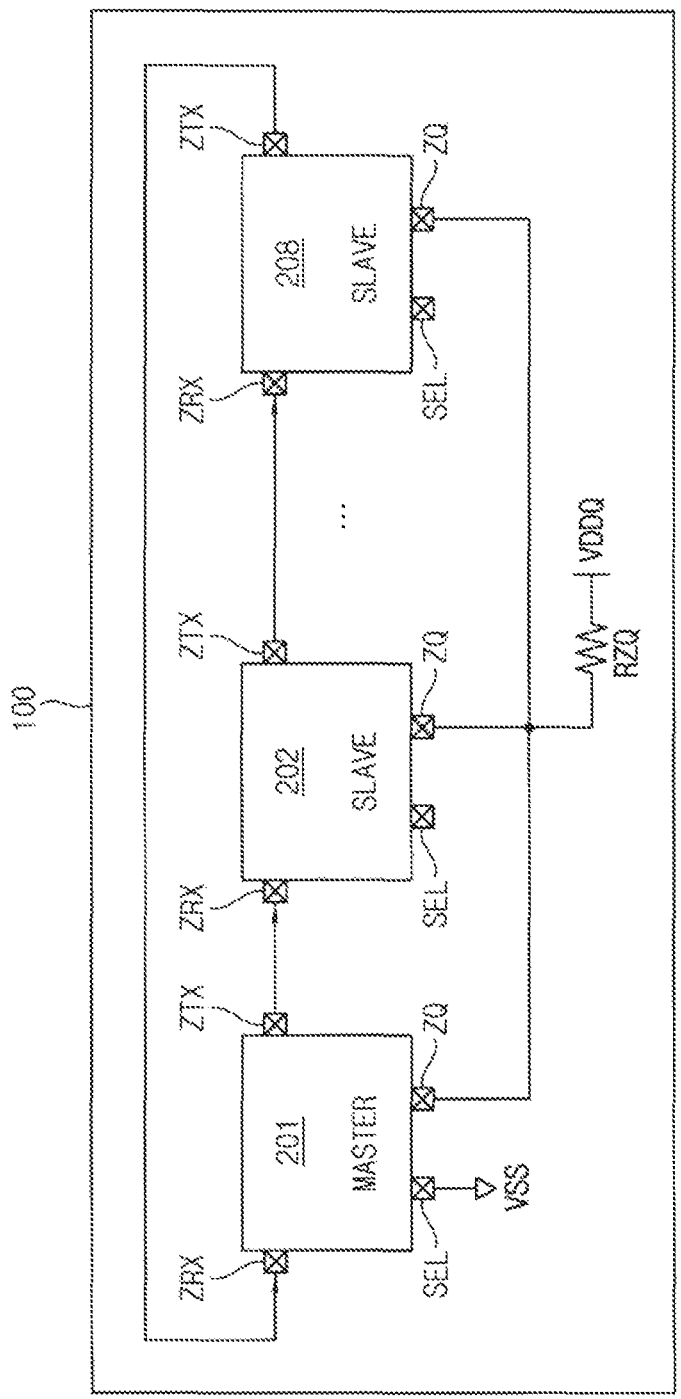
FIGS. 10 and 11 illustrate examples in which one of memory devices in the memory module in FIG. 1 is selected as the master according to exemplary embodiments of the inventive concept.
Figure 11:
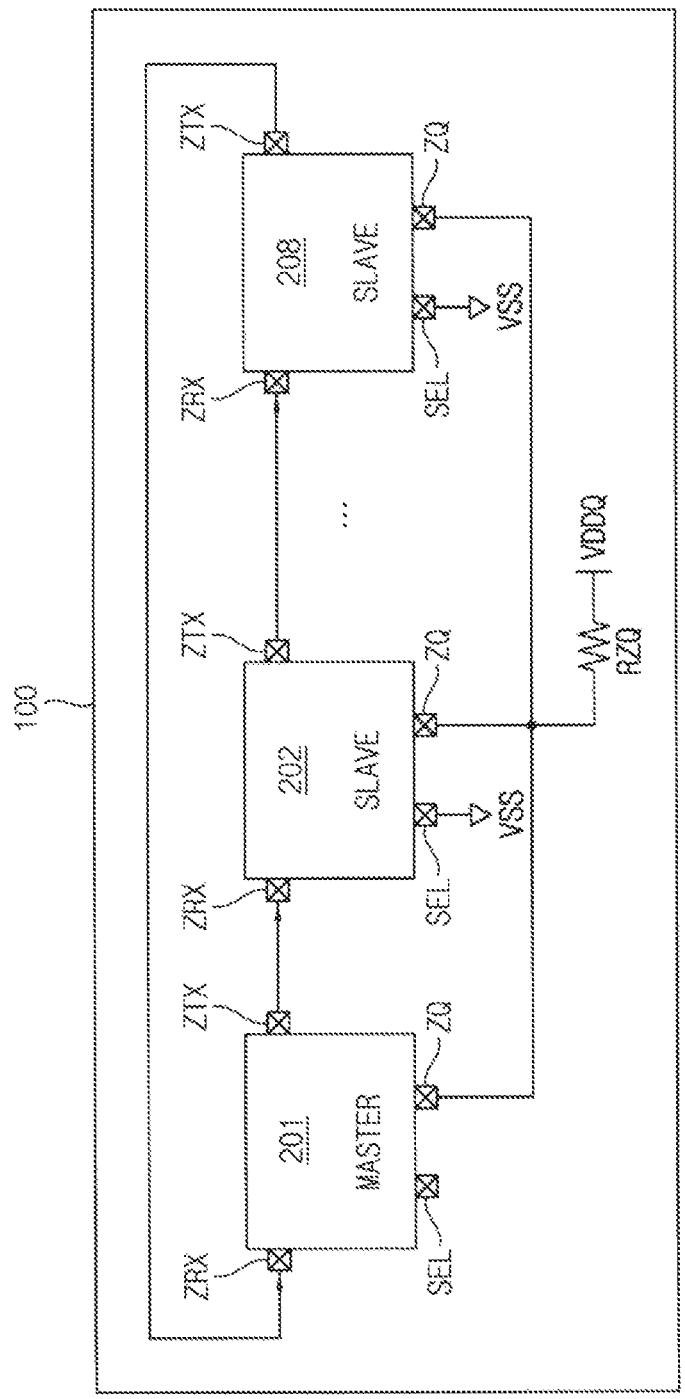

FIGS. 10 and 11 illustrate examples in which one of the memory devices in the memory module in FIG. 1 is selected as the master according to exemplary embodiments of the inventive concept.

In FIGS. 10 and 11, it is assumed that k is 8.

Referring to FIG. 10, the memory device 201 may be selected as the master by connecting the selection pad SEL of the memory device 201 to the ground voltage VSS and by floating each selection pad SEL of the memory devices (slaves) 202~208.

Referring to FIG. 11, the memory device 201 may be selected as the master by floating the selection pad SEL of the memory device 201 and by connecting each selection pad SEL of the memory devices 202~208 (slaves) to the ground voltage VSS.

In FIGS. 10 and 11, the power supply voltage VDDQ may be used instead of the ground voltage VSS.

Figure 12:
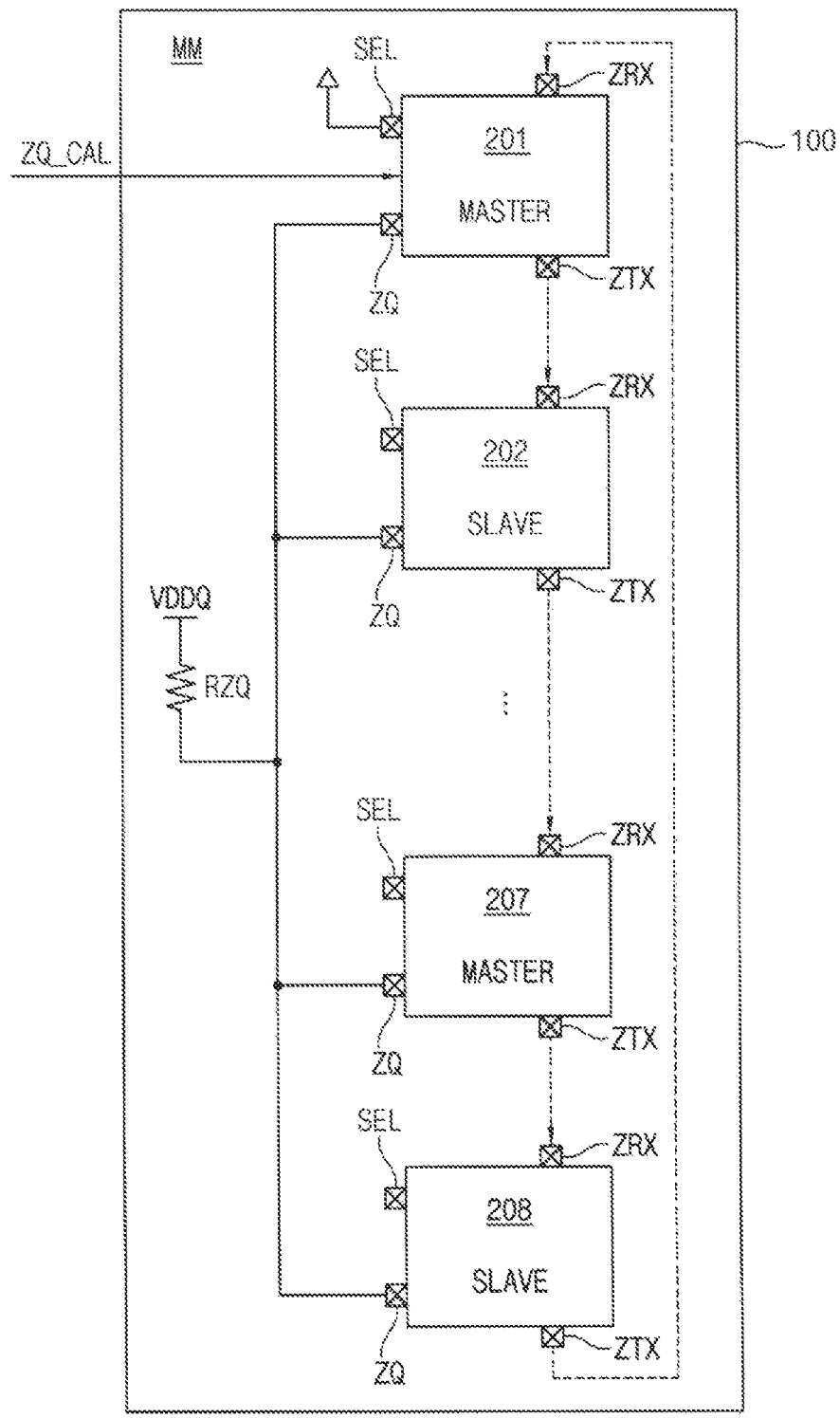
FIG. 12 illustrates a memory device selected as the master in the memory module in FIG. 1 receiving the impedance calibration command according to an exemplary embodiment of the inventive concept.
Figure 13:
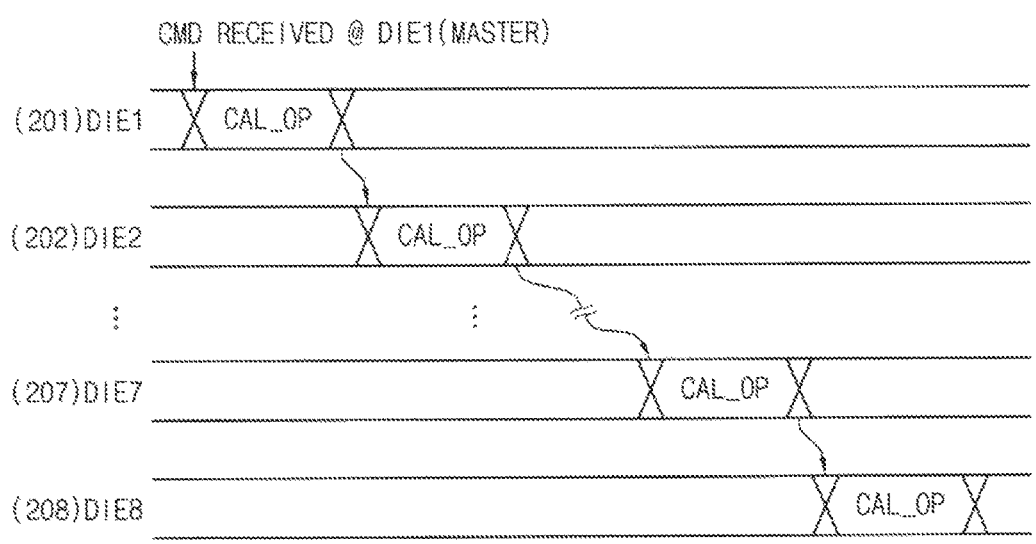
FIG. 13 illustrates that the impedance calibration is sequentially performed in the memory module of FIG. 12 according to an exemplary embodiment of the inventive concept.

FIG. 12 illustrates a memory device selected as the master in the memory module in FIG. 1 receiving the impedance calibration command and FIG. 13 illustrates that the impedance calibration is sequentially performed in the memory module of FIG. 12, according to an exemplary embodiment of the inventive concept.

Referring to FIGS. 12 and 13, the memory device 201 of the memory devices 201~208 (DIE1~DIE8) in the memory module (MM) 100 is selected as the master by connecting the selection pad SEL of the memory device 201 to the ground voltage VSS. The memory device 201 selected as the master (master memory device) receives the impedance calibration command ZQ_CAL from the memory controller 30, the master memory device 201 performs the impedance calibration operation (CAL_OP) in response to the impedance calibration command ZQ_CAL, and transfers the impedance calibration command ZQ_CAL to the adjacent memory device 202 after completion of the impedance calibration operation.

The memory device 202 performs the impedance calibration operation in response to the impedance calibration command ZQ_CAL and transfers the impedance calibration command ZQ_CAL to the adjacent memory device 203 after completion of the impedance calibration operation. In the memory module 100 of FIG. 12, the impedance calibration operation is sequentially performed in each of the memory devices 201~208 according to an order from the master memory device 201 to the memory device 208, and the impedance calibration operation in each of the memory devices 201~208 is not overlapped.

Figure 14:
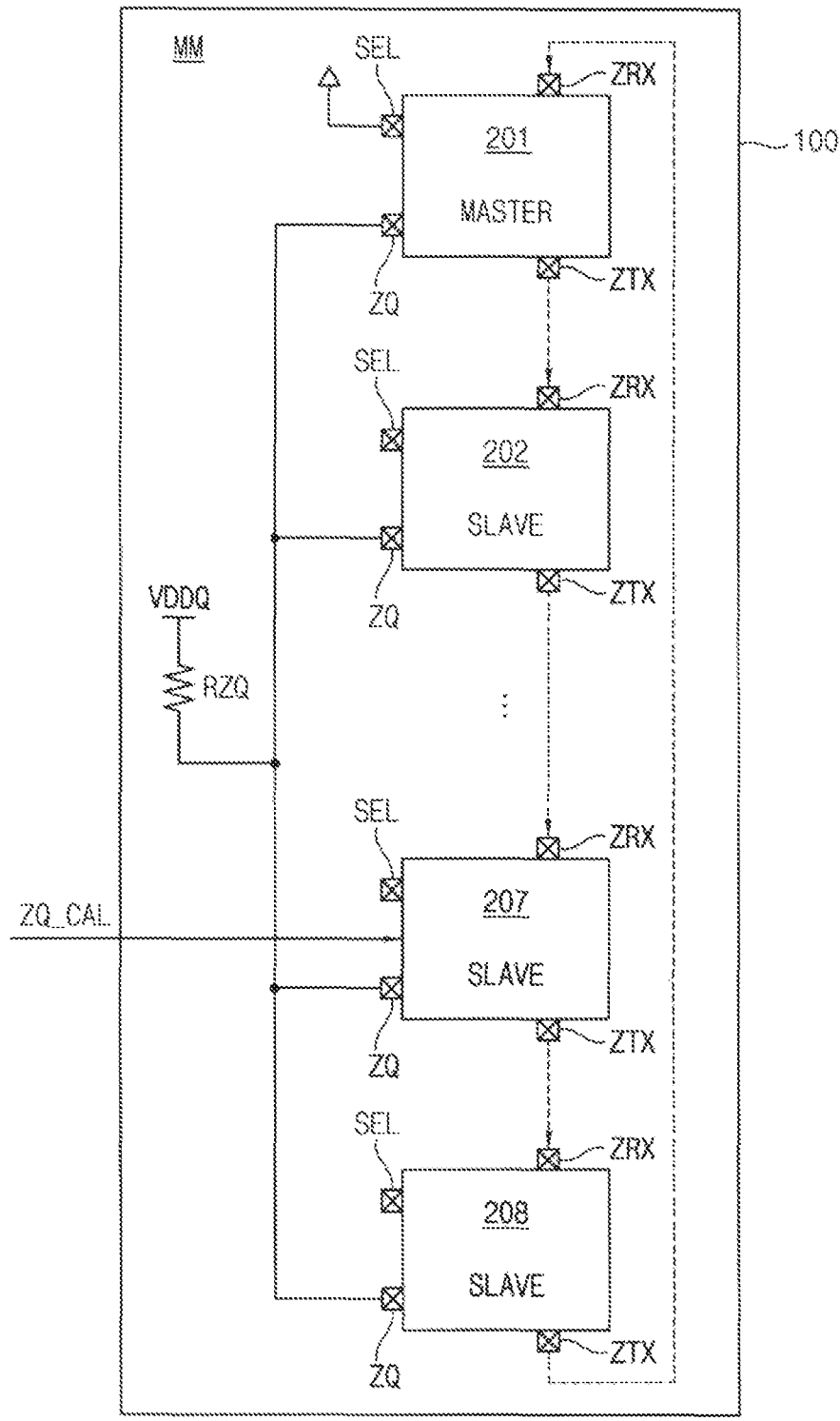
FIG. 14 illustrates a memory device, which is not selected as the master in the memory module in FIG. 1, receiving the impedance calibration command according to an exemplary embodiment of the inventive concept.
Figure 15:
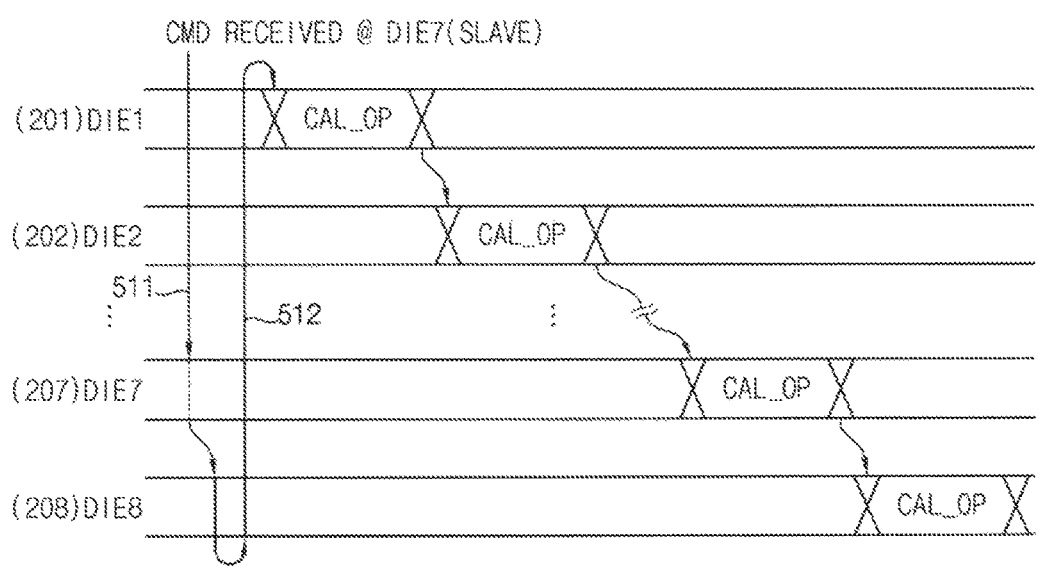
FIG. 15 illustrates that the impedance calibration is sequentially performed in the memory module of FIG. 14 according to an exemplary embodiment of the inventive concept.

FIG. 14 illustrates a memory device, which is not selected as the master in the memory module in FIG. 1, receiving the impedance calibration command and FIG. 15 illustrates that the impedance calibration is sequentially performed in the memory module of FIG. 14, according to an exemplary embodiment of the inventive concept.

Referring to FIGS. 14 and 15, the memory device 201 of the memory devices 201~208 (DIE1~DIE8) is selected as the master by connecting the selection pad SEL of the memory device 201 to the ground voltage VSS. The memory device 207, which is not selected as the master, receives the impedance calibration command ZQ_CAL from the memory controller 30 (511), and then the impedance calibration command ZQ_CAL is transferred to the memory device 201 selected as the master (master memory device) (512). As described with reference to FIG. 13, in the memory module 100 of FIG. 14, the impedance calibration operation (CAL_OP) is sequentially performed in each of the memory devices 201~208 according to an order from the master memory device 201 to the memory device 208 and the impedance calibration operation in each of the memory devices 201~208 is not overlapped.

Figure 16A:
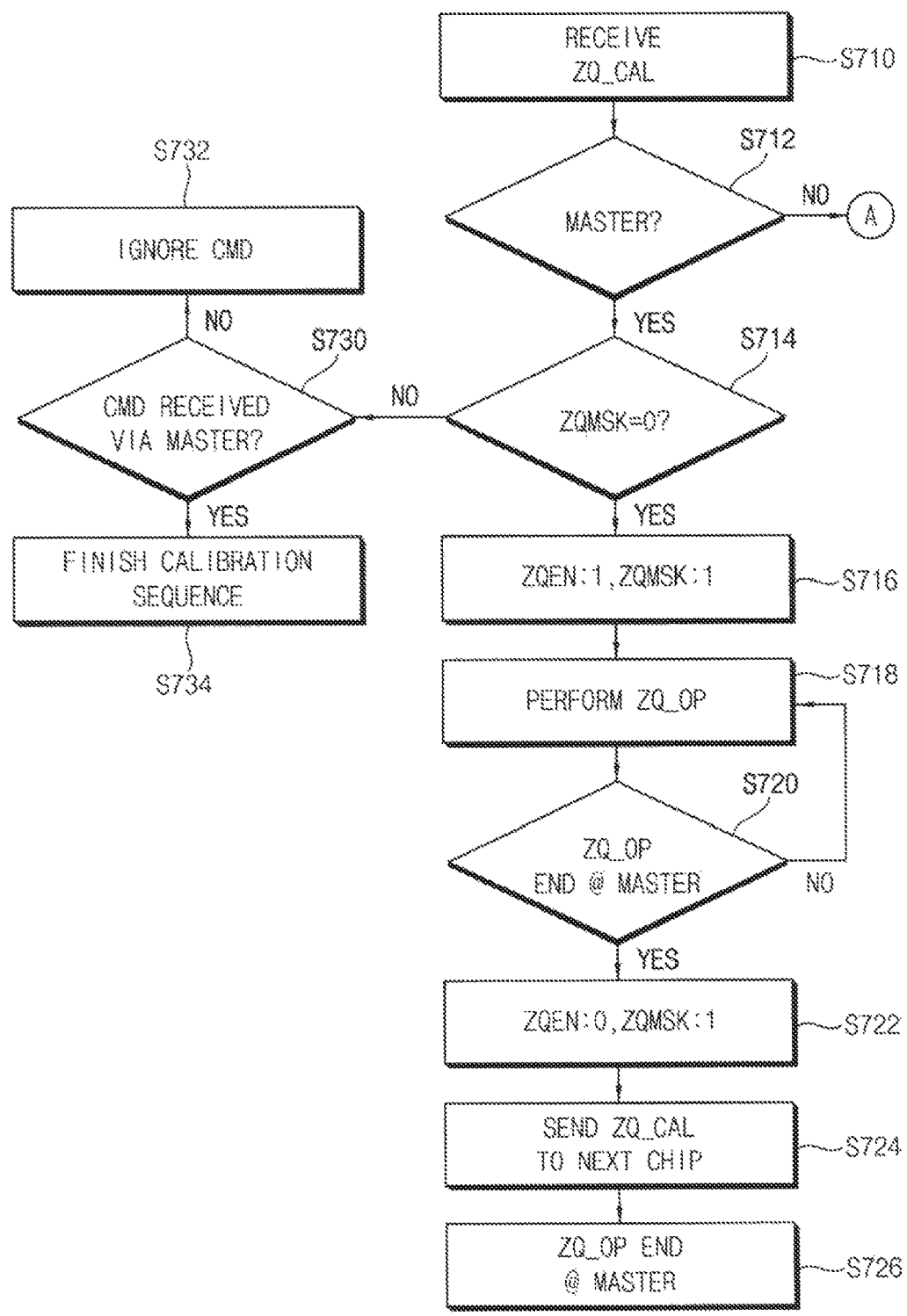
FIGS. 16A and 16B are flowcharts illustrating a method of calibrating an impedance of the memory device of FIG. 2 according to an exemplary embodiment of the inventive concept.
Figure 16B:
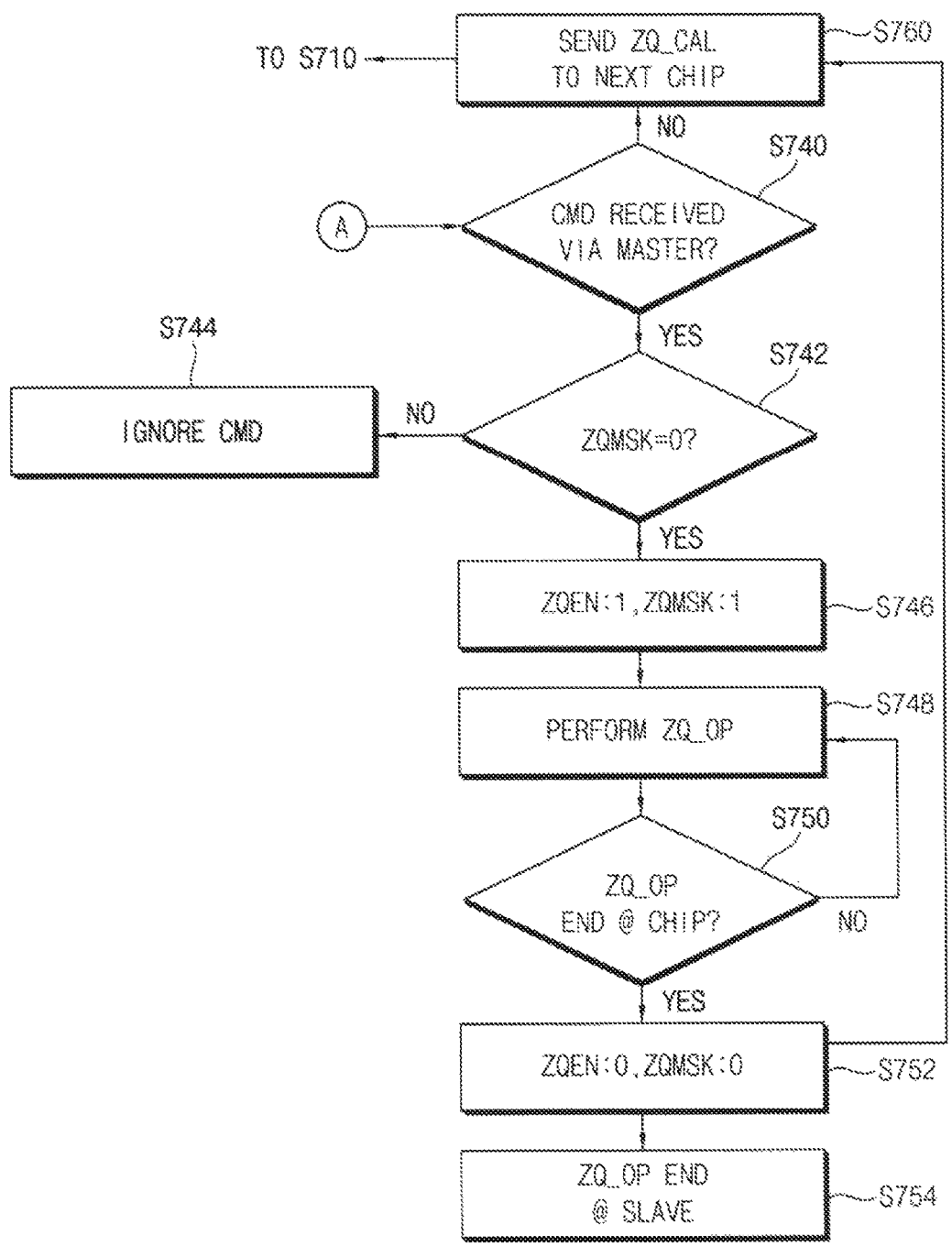

FIGS. 16A and 16B are flowcharts illustrating a method of calibrating an impedance of the memory device of FIG. 2 according to an exemplary embodiment of the inventive concept.

Referring to FIGS. 2 through 16B, the command controller 405 receives the impedance calibration command ZQ_CAL (S710). The command controller 405 determines whether a corresponding memory device is selected as the master based on the detection signal DS (S712). When the corresponding memory device is selected as the master (YES in S712), the command controller 405 determines whether the internal calibration mask signal ZQMSK in the state machine 415 has a low level (S714). When the calibration mask signal ZQMSK has a low level (YES in S714), this indicates that an impedance calibration operation is not performed because the corresponding memory device does not receive the impedance calibration command ZQ_CAL. When the calibration mask signal ZQMSK has a high level (NO in S714), the command controller 405 determines whether the impedance calibration command ZQ_CAL is received via the master memory device by referring to the tag information of the impedance calibration command ZQ_CAL (S730).

When the impedance calibration command ZQ_CAL is received via the master memory device (YES in S730), this indicates the impedance calibration command ZQ_CAL is received from an adjacent memory device via the master memory device and the impedance calibration operation is completed in each of the memory devices 201~208, and an impedance calibration sequence is finished (S734). When the impedance calibration command ZQ_CAL is received without passing by the master memory device (NO in S730), this indicates that the impedance calibration command ZQ_CAL is already received, and the command controller 405 ignores the impedance calibration command ZQ_CAL (S732).

When the calibration mask signal ZQMSK has a low level (YES in S714), the command controller 405 changes the calibration mask signal ZQMSK to a high level, and enables the calibration enable signal ZQEN to a first level to provide the calibration enable signal ZQEN to the calibration circuit 420 (S716). The calibration circuit 420 performs the impedance calibration operation ZQ_OP (S718). The state machine 415 determines whether the impedance calibration operation is completed in the corresponding memory device based on the transitions of the first comparison signal CS1 and the second comparison signal CS2 (S720).

When the impedance calibration operation is not completed in the corresponding memory device (NO in S720), the procedure returns to operation S718. When the impedance calibration operation is completed in the corresponding memory device (YES in S720), the command controller 405 maintains the calibration mask signal ZQMSK to a high level and disables the calibration enable signal ZQEN to a second level (S722).

The command controller 405 changes a level of the tag information of the impedance calibration command ZQ_CAL in response to the calibration mask signal ZQMSK with the high level and the calibration enable signal ZQEN with the second level, and transfers the impedance calibration command ZQ_CAL to the adjacent memory device (S724). The impedance calibration circuit 400 finishes the impedance calibration operation in the master memory device (S726).

When the corresponding memory device is not selected as the master (NO in S712), the command controller 405 determines whether the impedance calibration command ZQ_CAL passes by the master memory device by referring to the tag information (S740). When the impedance calibration command ZQ_CAL does not pass by the master memory device (NO in S740), the command controller 405 transfers the impedance calibration command ZQ_CAL to an adjacent memory device (S760) and operation S710 is performed again.

When the impedance calibration command ZQ_CAL passes by the master memory (YES in S740), the command controller 405 determines whether the internal calibration mask signal ZQMSK in the state machine 415 has the low level (S742). When the calibration mask signal ZQMSK has the high level (NO in S742), this indicates that the corresponding memory device has already received the impedance calibration command ZQ_CAL and the impedance calibration operation is already performed or is being performed, and the command controller 405 ignores the impedance calibration command ZQ_CAL (S744).

When the calibration mask signal ZQMSK has the low level (YES in S742), the command controller 405 changes the calibration mask signal ZQMSK to the high level, and enables the calibration enable signal ZQEN to the first level to provide the calibration enable signal ZQEN to the calibration circuit 420 (S746). The calibration circuit 420 performs the impedance calibration operation ZQ_OP (S748). The state machine 415 determines whether the impedance calibration operation is completed in the corresponding memory device based on the transitions of the first comparison signal CS1 and the second comparison signal CS2 (S750).

When the impedance calibration operation is not completed in the corresponding memory device (NO in S750), the procedure returns to operation S748. When the impedance calibration operation is completed in the corresponding memory device (YES in S750), the command controller 405 changes the calibration mask signal ZQMSK to the low level and disables the calibration enable signal ZQEN to the second level (S752).

The command controller 405 transfers the impedance calibration command ZQ_CAL to the adjacent memory device in response to the calibration mask signal ZQMSK with the low level and the calibration enable signal ZQEN with the second level (S760). The memory devices which are slaves finish the impedance calibration operation (S754).

As described above, in the memory module according to exemplary embodiments of the inventive concept, an impedance calibration operation is sequentially performed in each of the plurality of memory devices beginning from the master memory device. A memory device receiving the impedance calibration command does not have to be the master memory device, and the impedance calibration command is transferred to adjacent memory devices. Therefore, the impedance calibration operation in each of the memory devices is not overlapped, and a performance of the memory module may be enhanced.

Figure 17:
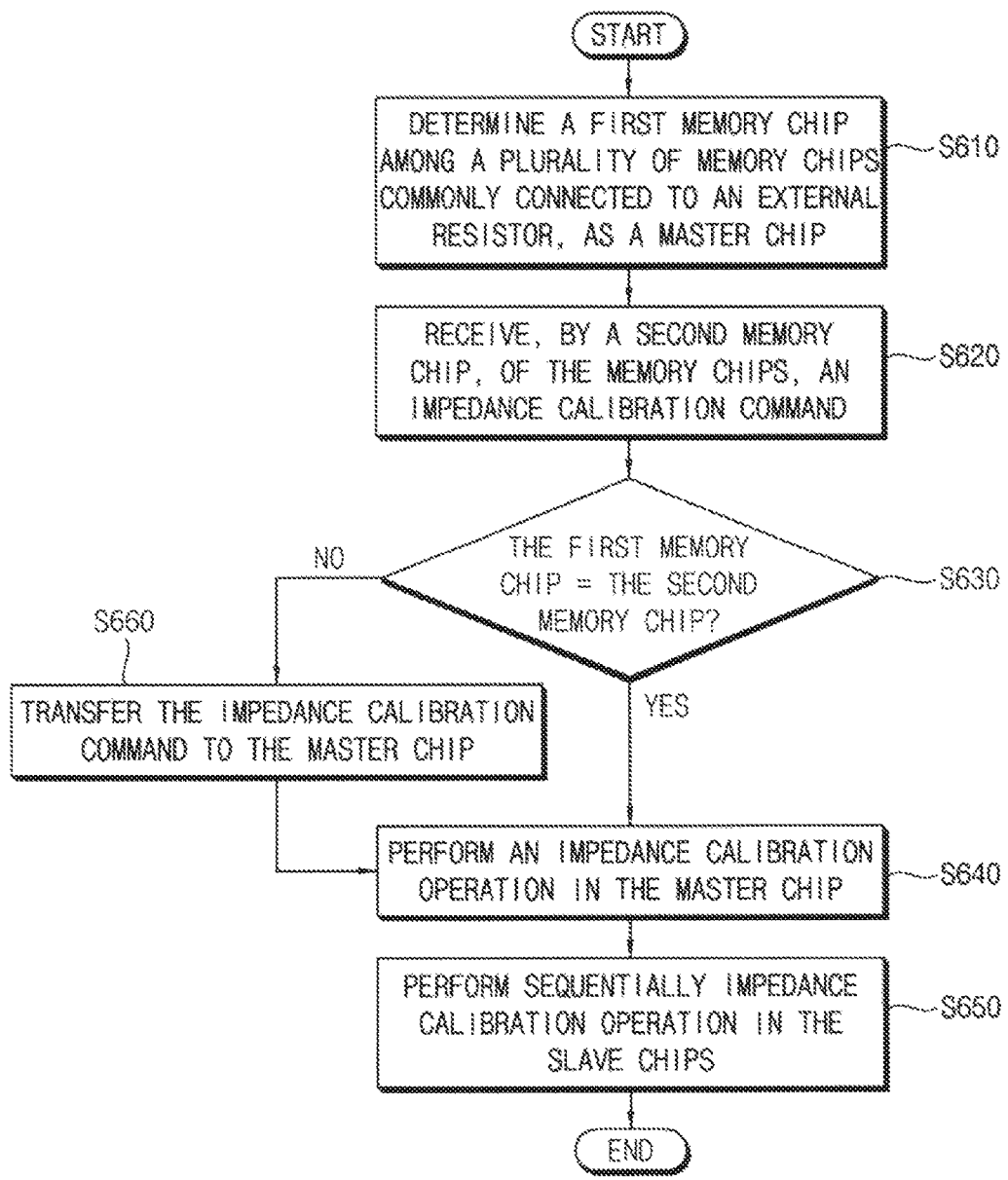
FIG. 17 is a flowchart illustrating a method of calibrating multi-die impedance of a memory module according to an exemplary embodiment of the inventive concept.

FIG. 17 is a flowchart illustrating a method of calibrating multi-die impedance of a memory module according to an exemplary embodiment of the inventive concept.

Referring to FIGS. 1 through 17, in a method of calibrating multi-die impedance of the memory module 100 including the external resistor RZQ and the plurality of memory devices 201~20k, where the external resistor RZQ is formed in the module board 110 and the plurality of memory devices 201~20k are commonly connected to the external resistor RZQ, a first memory device (for example, the memory device 201) of the plurality of memory devices 201~20k is selected as the master (S610). The first memory device 201 may be selected as the master by connecting the selection pad SEL to the ground voltage VSS.

A second memory device (one of the plurality of memory devices 201~20k) receives the impedance calibration command ZQ_CAL from the memory controller 30 (S620). The impedance calibration operation is sequentially performed in each of the plurality of memory devices 201~20k beginning from the first memory device (e.g., the master memory device) using a ring topology constituted by the first reception pad ZRX and the first transmission pad ZTX, which are included in each of the plurality of memory devices 201~20k, regardless of whether the first memory device matches with the second memory device (S630, S640, S650, S660). The first reception pad ZRX is associated with receiving the impedance calibration command ZQ_CAL from an adjacent memory device and the first transmission pad ZTX is associated with transmitting the impedance calibration command ZQ_CAL to an adjacent memory device.

To perform the impedance calibration operation sequentially from the first memory device, it is determined whether the first memory device matches with the second memory device (S630). In other words, the first memory device determines whether the impedance calibration command ZQ_CAL is received from a corresponding command decoder or from the associated first reception pad ZRX.

When the first memory device matches with the second memory device (YES in S630), the first memory device performs a corresponding impedance calibration operation in response to the impedance calibration command ZQ_CAL (S640), and transfers the impedance calibration command ZQ_CAL to an adjacent memory device after completion of the corresponding impedance calibration operation. Each of other memory devices, which are not selected as the master, performs a corresponding impedance calibration operation sequentially by receiving the impedance calibration command ZQ_CAL from the first memory device or an adjacent memory device (S650).

When the first memory device does not match with the second memory device (NO in s630), the second memory device transfers the impedance calibration command ZQ_CAL to the first memory device using the ring topology (S660). The operations S640 and S650 are then sequentially performed.

Therefore, as described above, the impedance calibration operation in each of the memory devices is sequentially performed from the first memory device and a performance of the memory module may be enhanced.

Figure 18:
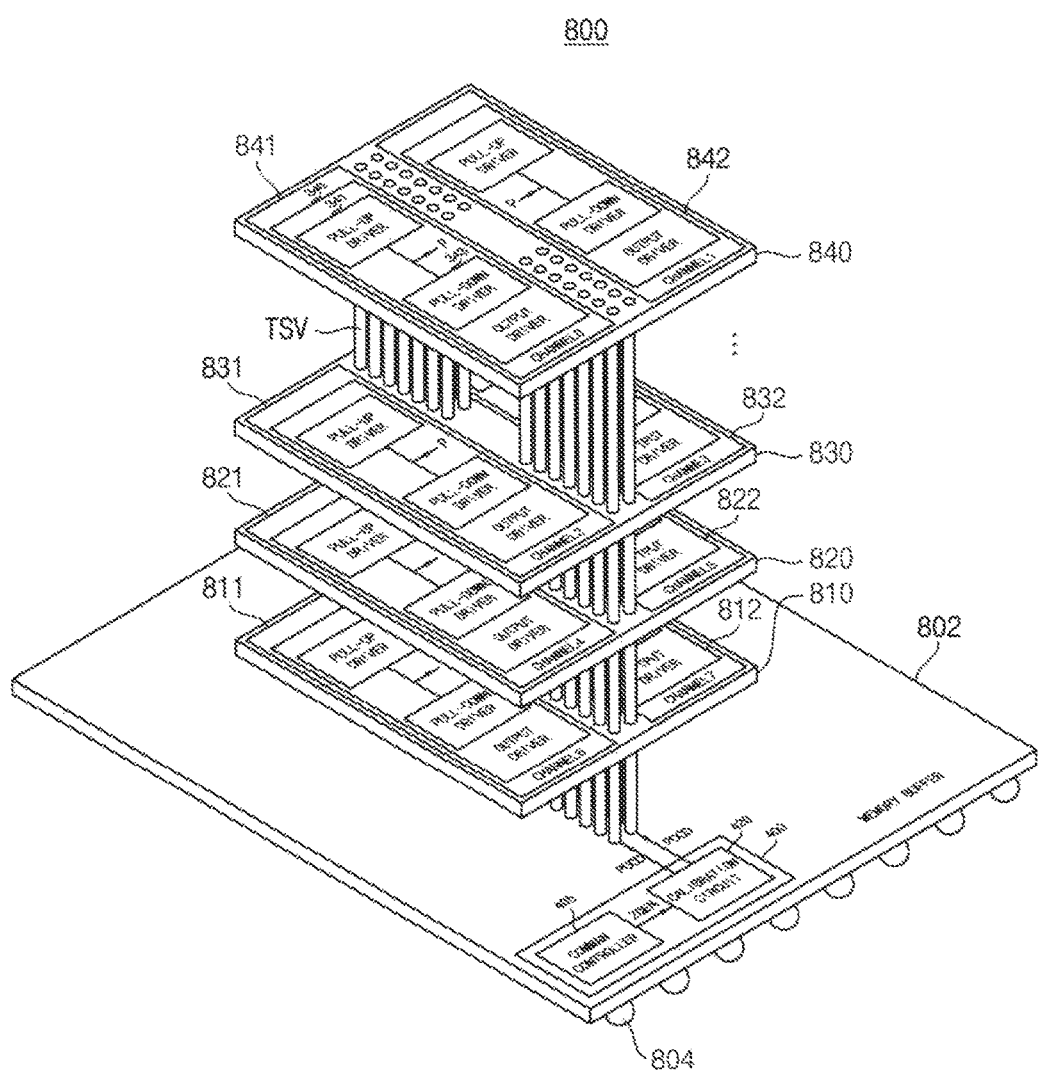
FIG. 18 illustrates a diagram of a multichip package including the impedance calibration circuit of FIG. 7 according to an exemplary embodiment of the inventive concept.

FIG. 18 illustrates a diagram of a multichip package including the impedance calibration circuit of FIG. 7 according to an exemplary embodiment of the inventive concept.

A multichip package refers to a semiconductor package in which a plurality of semiconductor chips or various types of semiconductor chips are stacked on one another so to form a package.

Referring to FIG. 18, a multichip package 800 may include a memory buffer 802 below memory layers 810 through 840 that are stacked on one another. The memory layers 810 through 840 may constitute a plurality of independent interfaces which are referred to channels. The memory layers 810 through 840 may respectively include two channels 811 and 812, 821 and 822, 831 and 832, and 841 and 842. The channels 811, 812, 821, 822, 831, 832, 841, and 842 include independent memory banks, and are independently clocked.

In the present exemplary embodiment, the multichip package 800 (or the semiconductor device 800), in which the four memory layers 810 through 840 are stacked together and include the eight channels 811, 812, 821, 822, 831, 832, 841, and 842, is provided as an example. According to exemplary embodiments of the inventive concept, 2 to 8 memory layers may be stacked together in the semiconductor device 800. According to exemplary embodiments of the inventive concept, each of the memory layers 810 through 840 may include 1 to 4 channels. According to exemplary embodiments of the inventive concept, a channel may be distributed over the memory layers 810 through 840.

The memory buffer 802 may provide a signal distribution function for receiving a command, an address, a clock, and data from a memory controller, and providing the received command, address, clock, and data to the memory layers 810 through 840. Since the memory buffer 802 buffers all of the command, the address, the clock, and the data, the memory controller may interface with the memory layers 810 through 840 by driving only the memory buffer 802.

The memory buffer 802 and the memory layers 810 through 840 may transceive signals with one another via through-substrate vias (e.g., through-silicon vias TSVs). The memory buffer 802 may communicate with the memory controller, which may be external, via a conductive element formed on an outer surface of the semiconductor device 800, for example, solder balls.

The memory buffer 802 may perform a calibration operation by using a ZQ solder ball 804. The memory buffer 802 may include the impedance calibration circuit 400 connected to the ZQ solder ball 804. The impedance calibration circuit 400 may include the calibration circuit 420 connected to the ZQ solder ball 804 and the command controller 405. The calibration circuit 420 generates the pull-up control code PUCD and the pull-down control code PDCD, and the command controller 405 controls the calibration circuit 420. The calibration circuit 420 generates the pull-up control code PUCD and the pull-down control code PDCD based on an external resistor connected to the ZQ solder ball 804 and the command controller 405 generates the calibration enable signal ZQEN based on an impedance calibration command.

The pull-up control code PUCD and the pull-down control code PDCD may be provided to the channels 811, 812, 821, 822, 831, 832, 841, and 842 of the memory layers 810 through 840 via the through-silicon vias (TSVs). The channels 811, 812, 821, 822, 831, 832, 841, and 842 of the memory layers 810 through 840 may include the output driver 340 connected to a data input/output pad P.

According to exemplary embodiments of the inventive concept, the output driver 340 connected to the data input/output pad P may be arranged in an input/output (I/O) circuit included in the memory buffer 802. The output driver 340 may include the pull-up driver 341 for pull-up terminating the pad P in response to the pull-up control code PUCD, and the pull-down driver 343 for pull-down terminating the pad P in response to the pull-down control code PDCD. A signal of the pad P may be transmitted to the memory buffer 802 via the through-silicon via TSV, and also transmitted to a data input/output solder ball.

Figure 19:
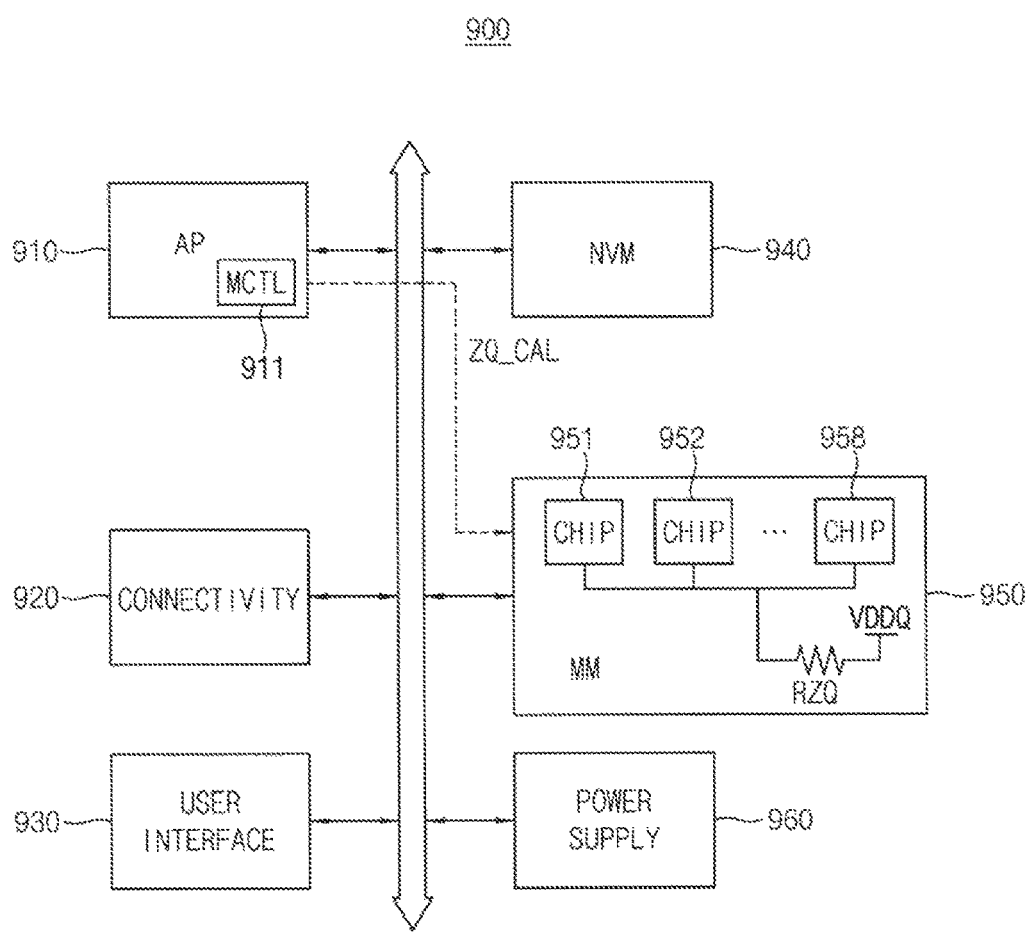
FIG. 19 illustrates a block diagram of a mobile system including the memory module of FIG. 1 according to an exemplary embodiment of the inventive concept.

FIG. 19 illustrates a block diagram of a mobile system including the memory module of FIG. 1 according to an exemplary embodiment of the inventive concept.

Referring to FIG. 19, a mobile system 900 includes an application processor 910, a connectivity circuit 920, a user interface 930, a nonvolatile memory device (NVM) 940, a memory module 950, and a power supply 960.

The application processor 910 may execute applications, such as a web browser, a game application, a video player, or the like. The application processor 910 may include a memory controller (MCTL) 911. The connectivity circuit 920 may perform wired or wireless communication with an external device. The memory module (MM) 950 may store data processed by the application processor 910 or operate as a working memory. The memory module 950 may correspond to the memory module 100 in FIG. 1. The memory module 950 may include a plurality of memory devices 951~958 commonly connected to the external resistor RZQ which is connected to the power supply voltage VDDQ. The memory devices 951~958 may sequentially perform the impedance calibration operation from a first memory device which is selected as a master, in response to the impedance calibration command from the memory controller 911.

The nonvolatile memory device 940 may for example store a boot image for booting the mobile system 900. The user interface 930 may include at least one input device such as a keypad, a touch screen, or the like, and at least one output device such as a speaker, a display device, or the like. The power supply 960 may supply the power supply voltage VDDQ to the mobile system 900.

In an exemplary embodiment of the inventive concept, the mobile system 900 and/or components of the mobile system 900 may be packaged in various forms.

The inventive concept as described above may be applied to systems using memory modules.

As such, according to exemplary embodiments of the inventive concept, an impedance calibration operation in each of memory devices in a memory module is sequentially performed from a first memory device and a performance of the memory module may be enhanced because the impedance calibration operation in each of the memory devices is not overlapped.

While the inventive concept has been shown and described with reference to exemplary embodiments thereof, it will be apparent to those of ordinary skill in the art that many modifications in form and details may be made thereto without materially departing from the spirit and scope of the inventive concept as set forth by the following claims.

What is claimed is:

1. A memory module comprising:
   an external resistor formed in a module board; and
   a plurality of memory devices including a first memory device and a second memory device, and commonly connected to the external resistor,
   wherein each of the plurality of memory devices comprises:
   an impedance pad connected to the external resistor; a selection pad;
   a first reception pad associated with receiving an impedance calibration command;
   a first transmission pad associated with transmitting the impedance calibration command; and an impedance calibration circuit connected to the first reception pad, the first transmission pad, the impedance pad, and the selection pad, wherein each of the plurality of memory device is configured to transfer the impedance calibration command to the first memory device, which is selected as a master, among the plurality of memory devices through a ring topology constituted by the first reception pad and the first transmission pad, wherein the first memory device is configured to perform an impedance calibration operation for the first memory device, to determine a resistance and a target output high level (VOH) voltage of an output driver, in response to the impedance calibration command, and is configured to transfer the impedance calibration command to the second memory device adjacent to the first memory device through the first transmission pad of the first memory device after performing the impedance calibration operation for the first memory device, wherein when the selection pad of the first memory device is connected to a ground voltage or a power supply voltage, the section pad of the second memory device is floated, and wherein when the selection pad of the first memory device is floated, the selection pad of the second memory device is connected to the ground voltage.

2. The memory module of claim 1, wherein the plurality of memory devices further includes a third memory device, wherein the second memory device is configured to perform the impedance calibration operation for the second memory device in response to the impedance calibration command and is configured to transfer the impedance calibration command to the third memory device adjacent to the second memory device through the first transmission pad of the second memory device after performing the impedance calibration operation for the second memory device, and wherein the third memory device is connected to the first transmission pad of the second memory device.

3. The memory module of claim 1, wherein the impedance calibration circuit comprises:

a detector connected to the selection pad, and configured to generate a detection signal;

a command controller connected to the first reception pad and the first transmission pad, wherein the command controller is configured to receive the impedance calibration command from one of the first reception pad and a corresponding command decoder; and a calibration circuit connected to the external resistor through the impedance pad, wherein the calibration circuit is configured to perform the impedance calibration operation in response to a calibration enable signal from the command controller to output a pull-up control code and a pull-down control code to the output driver, and is configured to provide the command controller with a first comparison signal and a second comparison signal which indicate a completion of the impedance calibration operation.

4. The memory module of claim 3, wherein:

the detector is configured to provide the command controller with the detection signal having a first logic level when a corresponding memory device is selected as the master; and the detector is configured to provide the command controller with the detection signal having a second logic level when the corresponding memory device is not selected as the master.

5. The memory module of claim 3, wherein:

the command controller is configured to enable the calibration enable signal and provide the calibration enable signal to the calibration circuit when the detection signal indicates that a corresponding memory device is selected as the master and the impedance calibration command is received from the first reception pad or the corresponding command decoder;

the calibration circuit is configured to perform the impedance calibration operation in response to the impedance calibration command, and is configured to transit logic levels of the first comparison signal and the second comparison signal when the impedance calibration operation is completed; and the command controller is configured to change tag information of the impedance calibration command to a first level based on transitions of the first comparison signal and the second comparison signal and is configured to transfer the impedance calibration command to an adjacent memory device through the first transmission pad.

6. The memory module of claim 3, wherein:

the command controller is configured to enable the calibration enable signal and provide the calibration enable signal to the calibration circuit when the detection signal indicates that a corresponding memory device is not selected as the master, tag information of the impedance calibration command has a first logic level, and the impedance calibration command is received from the first reception pad;

the calibration circuit is configured to perform the impedance calibration operation in response to the impedance calibration command, and is configured to transit logic levels of the first comparison signal and the second comparison signal when the impedance calibration operation is completed; and the command controller is configured to transfer the impedance calibration command to an adjacent memory device through the first transmission pad based on transitions of the first comparison signal and the second comparison signal.

7. The memory module of claim 3, wherein:

the command controller is configured to disable the calibration enable signal and provide the calibration enable signal to the calibration circuit when the detection signal indicates that a corresponding memory device is not selected as the master, tag information of the impedance calibration command has a second logic level, and the impedance calibration command is received from the first reception pad or the corresponding command decoder; and the command controller is configured to transfer the impedance calibration command to an adjacent memory device through the first transmission pad.

8. The memory module of claim 3, wherein the command controller comprises:

a path decision logic configured to receive the impedance calibration command from one of the first reception pad and the corresponding command decoder and is configured to provide a path information signal that indicates a reception path of the impedance calibration command and tag information;

a signal generator configured to determine a logic level of the calibration enable signal in response to the detection signal and the path information signal to output the calibration enable signal; and a state machine configured to determine a logic level of an internal calibration mask signal based on the calibration enable signal and transitions of the first comparison signal and the second comparison signal,
wherein the signal generator is further configured to provide the path decision logic with a path control signal to control a transfer of the impedance calibration command and a change of the tag information based on a state of the state machine.

9. The memory module of claim 3, wherein the calibration circuit comprises:
a first code generator configured to generate the pull-up control code obtained from a result of comparing the target VOH voltage with a first voltage at a first node between a pull-up driver and a first replica pull-down driver;
a first code storing circuit configured to store the pull-up control code when the target VOH voltage becomes substantially the same as the first voltage;
a second code generator configured to generate the pull-down control code obtained from a result of comparing the target VOH voltage with a second voltage at a second node connected to the impedance pad; and
a second code storing circuit configured to store the pull-down control code when the target VOH voltage becomes substantially the same as the second voltage.

10. The memory module of claim 3, wherein each of the plurality of memory devices further comprises:
a data output circuit configured to output a data signal by driving data based on the pull-up control code and the pull-down control code, and
wherein the data output circuit includes the output driver.

11. The memory module of claim 10, wherein each of the plurality of memory devices further comprises:
a memory cell array configured to store the data and to provide the stored data to the data output circuit, and
wherein the memory cell array includes a plurality of dynamic memory cells.

12. A memory system comprising:
a memory module including an external resistor and a plurality of memory devices including a first memory device and a second memory device, wherein the external resistor is formed in a module board and the plurality of memory devices are commonly connected to the external resistor; and
a memory controller configured to control the memory module,
wherein each of the plurality of memory devices comprises:
a first reception pad associated with receiving an impedance calibration command;
a first transmission pad associated with transmitting the impedance calibration command;
an impedance pad connected to the external resistor;
a selection pad; and
an impedance calibration circuit connected to the first reception pad, the first transmission pad, the impedance pad, and the selection pad,
wherein each of the plurality of memory devices is configured to transfer the impedance calibration command to the first memory device, which is selected as a master among the plurality of memory devices, through a ring topology constituted by the first reception pad and the first transmission pad,
wherein the first memory device is configured to perform an impedance calibration operation for the first memory device, to determine a resistance and a target output high level (VOH) voltage of an output driver, in response to the impedance calibration command, and is configured to transfer the impedance calibration command to the second memory device adjacent to the first memory device through the first transmission pad of the first memory device after performing the impedance calibration operation for the first memory device, and
wherein the impedance calibration circuit comprises:
a detector connected to the selection pad, and configured to generate a detection signal;
a command controller connected to the first reception pad and the first transmission pad, wherein the command controller is configured to receive the impedance calibration command from one of the first reception pad a corresponding command decoder; and
a calibration circuit connected to the external resistor through the impedance pad, wherein the calibration circuit is configured to perform the impedance calibration operation in response to a calibration enable signal from the command controller to output a pull-up control code and a pull-down control code to the output driver, and is configured to provide the command controller with a first comparison signal and a second comparison signal which indicate a completion of the impedance calibration operation.

13. The memory system of claim 12, wherein each of the plurality of memory devices is a low power double data rate 4 (LPDDR4) synchronous memory device.

14. A method of calibrating multi-die impedance of a memory module including an external resistor and a plurality of memory devices, wherein the external resistor is formed in a module board and the plurality of memory devices are commonly connected to the external resistor, the method comprising:
selecting a first memory device of the plurality of memory devices as a master;
receiving, in a second memory device of the plurality of memory devices, an impedance calibration command; and
performing an impedance calibration operation sequentially in each of the plurality of memory devices from the first memory device using a ring topology constituted by a first reception pad and a first transmission pad included in each of the plurality of memory devices,
wherein the first reception pad is associated with receiving the impedance calibration command and the first transmission pad is associated with transmitting the impedance calibration command, and
wherein performing the impedance calibration operation sequentially in each of the plurality of memory devices from the first memory device comprises:
determining whether the first memory device matches with the second memory device; and
transferring, by the second memory device, the impedance calibration command to the first memory device using the ring topology, when the first memory device does not match with the second memory device.

15. The method of claim 14, wherein performing the impedance calibration operation sequentially in each of the plurality of memory devices from the first memory device further comprises:
performing, in the first memory device, the impedance calibration operation for the first memory device, in response to the impedance calibration command; and
performing, in each of other memory devices which are not selected as the master, the impedance calibration operation sequentially by receiving the impedance calibration command from the first memory device or an adjacent memory device.

16. The method of claim 14, wherein each of the plurality of memory devices is configured to determine a resistance and a target output high level voltage of an output driver by performing the impedance calibration operation, and
wherein the output driver is configured to output data externally to each of the plurality of memory devices.

* * * * *